(12) United States Patent
Lee et al.

(10) Patent No.: US 10,756,702 B2
(45) Date of Patent: Aug. 25, 2020

(54) ACOUSTIC RESONATOR AND ACOUSTIC RESONATOR FILTER INCLUDING THE SAME

(71) Applicant: SAMSUNG ELECTRO-MECHANICS CO., LTD., Suwon-si (KR)

(72) Inventors: Tae Kyung Lee, Suwon-si (KR); Tae Yoon Kim, Suwon-si (KR); Jong Woon Kim, Suwon-si (KR); Moon Chul Lee, Suwon-si (KR); Yong Jin Kang, Suwon-si (KR); Nam Jung Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 41 days.

(21) Appl. No.: 16/190,573

(22) Filed: Nov. 14, 2018

(65) Prior Publication Data

US 2019/0386641 A1    Dec. 19, 2019

(30) Foreign Application Priority Data

Jun. 15, 2018   (KR) .......................... 10-2018-0068717

(51) Int. Cl.
*H03H 9/13*   (2006.01)
*H03H 9/02*   (2006.01)
(Continued)

(52) U.S. Cl.
CPC .............. *H03H 9/132* (2013.01); *H03H 3/02* (2013.01); *H03H 9/02118* (2013.01);
(Continued)

(58) Field of Classification Search
CPC .......... H03H 9/174; H03H 9/588; H03H 3/02; H03H 9/132; H03H 2003/023;
(Continued)

(56) References Cited

U.S. PATENT DOCUMENTS 7,629,865 B2 * 12/2009 Ruby ................. H03H 9/02118
                                                             333/188
2010/0237750 A1   9/2010 Sakashita et al.
(Continued)

FOREIGN PATENT DOCUMENTS

JP         4944145 B2      5/2012
JP       2016-225746 A    12/2016

*Primary Examiner* — Robert J Pascal
*Assistant Examiner* — Jorge L Salazar, Jr.
(74) *Attorney, Agent, or Firm* — NSIP Law

(57) ABSTRACT

An acoustic resonator includes a substrate, and a resonant portion comprising a center portion in which a first electrode, a piezoelectric layer and a second electrode are sequentially laminated on the substrate, and an extending portion disposed along a periphery of the center portion, wherein the resonant portion is configured to have an asymmetrical polygonal plane, an insertion layer is disposed below the piezoelectric layer in the extending portion, and the piezoelectric layer is configured to have a top surface which is raised to conform to a shape of the insertion layer, and the insertion layer is configured to have an asymmetrical polygonal shape corresponding to a shape of the extending portion.

20 Claims, 18 Drawing Sheets

(51) Int. Cl.
*H03H 9/17* (2006.01)
*H03H 9/58* (2006.01)
*H03H 3/02* (2006.01)
*H03H 9/15* (2006.01)
*H03H 9/54* (2006.01)

(52) U.S. Cl.
CPC .......... *H03H 9/02157* (2013.01); *H03H 9/15* (2013.01); *H03H 9/171* (2013.01); *H03H 9/173* (2013.01); *H03H 9/174* (2013.01); *H03H 9/175* (2013.01); *H03H 9/178* (2013.01); *H03H 9/54* (2013.01); *H03H 9/588* (2013.01); *H03H 2003/021* (2013.01); *H03H 2003/023* (2013.01); *H03H 2003/025* (2013.01)

(58) Field of Classification Search
CPC .. H03H 9/173; H03H 9/175; H03H 2003/021; H03H 2003/025; H03H 9/02118; H03H 9/15; H03H 9/54; H03H 9/02157; H03H 9/171; H03H 9/178
USPC .......................... 333/133, 187, 188; 310/312
See application file for complete search history.

(56) References Cited

U.S. PATENT DOCUMENTS

| | | |
|---|---|---|
| 2014/0118087 A1 | 5/2014 | Burak et al. |
| 2016/0126930 A1* | 5/2016 | Zou ...................... H01L 41/047 333/187 |
| 2016/0353221 A1 | 12/2016 | Okamura et al. |

* cited by examiner

| Width of second electrode in extending portion (um) | Atten (dB) | Kt2 (%) | Width of second electrode in extending portion (um) / length of inclined surface (um) |
|---|---|---|---|
| −1.8 | 25.97 | 9.37 | -- |
| −1.6 | 25.98 | 9.37 | -- |
| −1.4 | 25.97 | 9.38 | -- |
| −1.2 | 26.22 | 9.37 | -- |
| −1 | 26.22 | 9.37 | -- |
| −0.8 | 25.35 | 9.35 | -- |
| −0.6 | 24.91 | 9.36 | -- |
| −0.4 | 24.33 | 9.43 | -- |
| −0.2 | 26.95 | 9.55 | -- |
| 0 | 27.52 | 9.5 | 0 |
| 0.2 | 31.13 | 9.59 | 0.23 |
| 0.4 | 39.32 | 9.49 | 0.46 |
| 0.6 | 41.15 | 9.39 | 0.69 |
| 0.8 | 38.29 | 9.33 | 0.92 |
| 1 | 35.34 | 9.29 | 1.15 |
| 1.2 | 33.4 | 9.26 | 1.38 |
| 1.4 | 32.78 | 9.24 | 1.61 |
| 1.6 | 33.75 | 9.23 | 1.84 |
| 1.8 | 35.19 | 9.2 | 2.07 |
| 2 | 37.65 | 9.15 | 2.3 |
| 2.2 | 39.98 | 9.09 | 2.53 |
| 2.4 | 38.83 | 9.02 | 2.76 |
| 2.6 | 36.49 | 8.97 | 2.99 |
| 2.8 | 34.93 | 8.94 | 3.22 |
| 3 | 34.96 | 8.9 | 3.45 |
| 3.2 | 35.67 | 8.88 | 3.68 |
| 3.4 | 36.6 | 8.84 | 3.91 |
| 3.6 | 37.24 | 8.79 | 4.14 |
| 3.8 | 37.37 | 8.75 | 4.37 |
| 4 | 37.81 | 8.71 | 4.6 |
| 4.2 | 38.76 | 8.66 | 4.83 |
| 4.4 | 38.28 | 8.62 | 5.06 |
| 4.6 | 36.71 | 8.57 | 5.29 |
| 4.8 | 35.4 | 8.54 | 5.52 |
| 5 | 35.06 | 8.5 | 5.75 |
| 5.2 | 35.02 | 8.48 | 5.98 |
| 5.4 | 35.52 | 8.45 | 6.21 |
| 5.6 | 35.78 | 8.43 | 6.44 |
| 5.8 | 38.28 | 8.39 | 6.67 |
| 6 | 38.78 | 8.33 | 6.9 |
| 6.2 | 37.37 | 8.27 | 7.13 |
| 6.4 | 35.54 | 8.24 | 7.36 |
| 6.6 | 34.77 | 8.22 | 7.59 |
| 6.8 | 35.55 | 8.19 | 7.82 |
| 7 | 36.41 | 8.14 | 8.05 |

FIG. 21

Interface length
① Boundary of center portion(G0): $n\lambda$
② Reflection interface(F0): $(n+\frac{1}{4})\lambda$
Ratio of G0 interface length to F0 interface length = $n : (n+\frac{1}{4})$ (b)

Difference between G0 thickness and F0 thickness: $\Delta T = \frac{1}{4}\lambda \cdot \tan\theta$

ACOUSTIC RESONATOR AND ACOUSTIC RESONATOR FILTER INCLUDING THE SAME

CROSS-REFERENCE TO RELATED APPLICATION

This application claims benefit under 35 USC § 119(a) of Korean Patent Application No. 10-2018-0068717 filed on Jun. 15, 2018 in the Korean Intellectual Property Office, the disclosure of which is incorporated herein by reference for all purposes.

BACKGROUND

1. Field

This application relates to an acoustic resonator and an acoustic resonator filter including the same.

2. Description of Related Art

With the recent trend toward the miniaturization of wireless communications devices, there is a demand for miniaturization technologies for radio-frequency components. A bulk acoustic wave (BAW) resonator type filter which implements semiconductor thin film wafer manufacturing technology is a representative device.

In a bulk acoustic wave (BAW) resonator, a thin film type element which generates resonance through a piezoelectric dielectric material being deposited on a silicon wafer, a semiconductor substrate which implements piezoelectric characteristics of the piezoelectric dielectric material, may be used as a filter.

Such a bulk acoustic wave (BAW) resonator may be implemented in mobile communications devices, compact and lightweight filters for chemical devices, biological devices, and similar devices, oscillators, resonant elements, acoustic resonant mass sensors, and similar devices.

Various structural shapes and functions have been conducted to improve characteristics and performance of the bulk acoustic wave (BAW) resonator, and there have been improvement into methods of manufacturing the BAW resonator.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an acoustic resonator includes a substrate, and a resonant portion comprising a center portion in which a first electrode, a piezoelectric layer and a second electrode are sequentially laminated on the substrate, and an extending portion disposed along a periphery of the center portion, wherein the resonant portion is configured to have an asymmetrical polygonal plane, an insertion layer is disposed below the piezoelectric layer in the extending portion, and the piezoelectric layer is configured to have a top surface which is raised to conform to a shape of the insertion layer, and the insertion layer is configured to have an asymmetrical polygonal shape corresponding to a shape of the extending portion.

The insertion layer may be configured to have an inclined surface which has a thickness that is increased as a distance of the insertion layer from the center portion increases, and the piezoelectric layer may include an inclined portion that is disposed on the inclined surface.

The insertion layer may be configured to have at least a portion which is disposed below the first electrode or the second electrode or between the first electrode and the piezoelectric layer.

The second electrode may be configured to have at least a portion disposed in the extending portion.

The second electrode disposed in the extending portion may be configured to be disposed on an inclined surface of the inclined portion of the piezoelectric layer, and may be configured to be disposed to have an area smaller than an area of the inclined surface of the inclined portion of the piezoelectric layer.

The second electrode disposed within the extending portion may be configured to be disposed on an entire inclined surface of the inclined portion of the piezoelectric layer.

The piezoelectric layer may include an extending portion that extends outwardly from the inclined portion of the piezoelectric layer, and the second electrode may be configured to be disposed on the inclined portion of the piezoelectric layer and the extending portion of the piezoelectric layer.

The insertion layer may include at least three sides and at least three vertices on which the at least three sides are connected, and an angle of inclination of the inclined surface in a center of each of the at least three sides may be different from an angle of inclination of the inclined surface at an end of each of the at least three sides.

The angle of inclination of the inclined surface in the center of each of the at least three sides of the insertion layer may be smaller than the angle of inclination of the inclined surface at the end of each of the at least three sides.

The angle of inclination of the inclined surface at the end of each of the at least three sides of the insertion layer may be greater than the angle of inclination of the inclined surface in the center of each of the at least three sides by 5 degrees or more.

The angle of inclination of the insertion layer may be configured to be in a range of 5 to 70 degrees.

The insertion layer may be formed of a material that is different from a material of the piezoelectric layer.

The insertion layer may be formed of a dielectric.

In a general aspect, an acoustic resonator filter includes a substrate, and a first resonator and a second resonator disposed adjacent to the substrate, each of the first resonator and the second resonator are configured to have a plane of an asymmetrical polygonal shape, wherein each of the first resonator and the second resonator includes a center portion in which a first electrode, a piezoelectric layer, and a second electrode are sequentially laminated, and an extending portion disposed along a periphery of the center portion, and wherein an insertion layer is disposed below the piezoelectric layer in the extending portion, and the piezoelectric layer is configured to have a top surface which is raised to conform to a shape of the insertion layer.

One side of the asymmetrical polygonal shape formed by the first resonator and one side of the asymmetrical polygonal shape formed by the second resonator may be disposed to face each other.

The insertion layer may include at least three sides arranged linearly and having an inclined surface and at least three vertices on which the at least three sides are connected, and the inclined surface may have an angle of inclination at a center of a side different from an angle of inclination at an end of each of the at least three sides.

In a general aspect, a method includes forming an acoustic resonator on a surface of a substrate, forming a resonant portion at a center portion of the acoustic resonator, the center portion comprising a first electrode, a piezoelectric layer and a second electrode sequentially laminated on the substrate, and an extending portion disposed along a periphery of the center portion, forming the resonant portion to have an asymmetrical polygonal plane, forming an insertion layer below the piezoelectric layer in the extending portion, forming the piezoelectric layer to have a top surface which is raised to conform to a shape of the insertion layer, and forming the insertion layer to have an asymmetrical polygonal shape corresponding to a shape of the extending portion.

The insertion layer may be formed to have an inclined surface which has a thickness that is increased as a distance of the insertion layer from the center portion increases, wherein the piezoelectric layer may include an inclined portion that is disposed on the inclined surface.

The insertion layer may be configured to have at least a portion which is disposed below the second electrode or between the first electrode and the piezoelectric layer.

The second electrode may be configured to have at least a portion disposed in the extending portion.

BRIEF DESCRIPTION OF THE DRAWINGS

FIG. 21 is a table drawn by summarizing values of the graph in FIG. 20; and

Figure 1A:
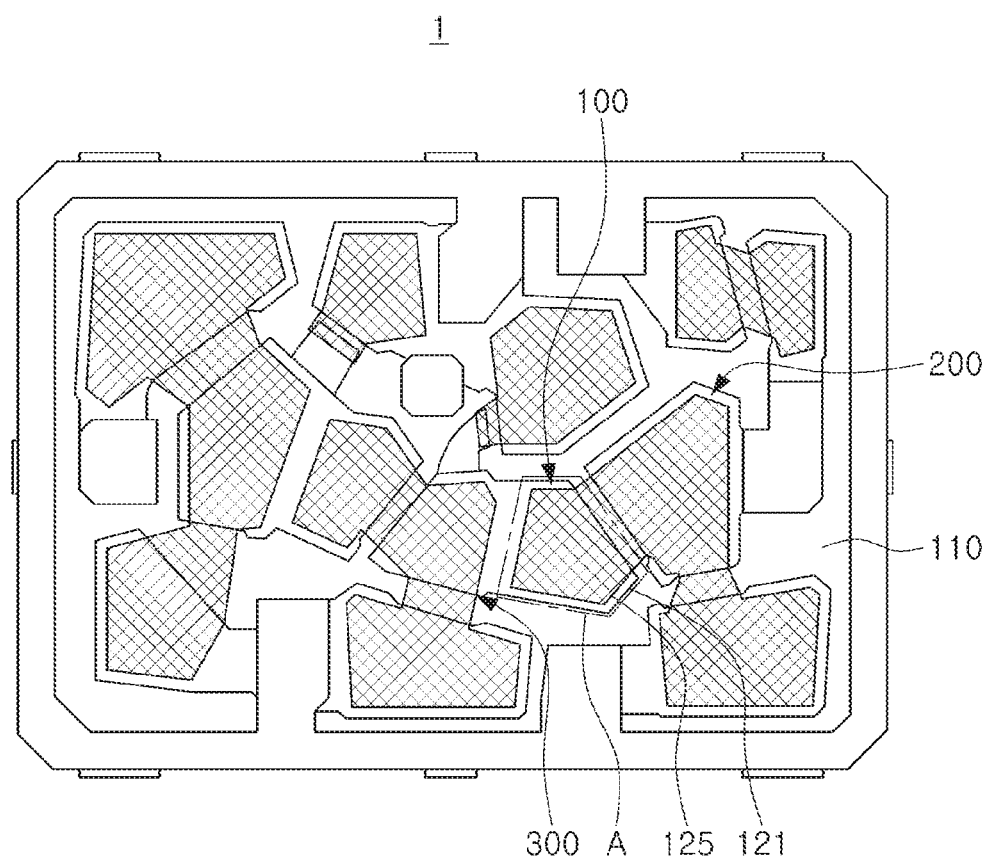
FIG. 1A is a plan view of an acoustic resonator filter according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

When a component is mentioned as being "connected" to or "accessing" another component, this may mean that it is directly connected to or accessing the other component, but it is to be understood that another component may exist therebetween. On the other hand, when a component is mentioned as being "directly connected" to or "directly accessing" another component, it is to be understood that there are no other components in-between.

Terms used in the present specification are for explaining the examples rather than limiting the present invention. Unless explicitly described to the contrary, a singular form includes a plural form in the present specification.

Figure 1B:
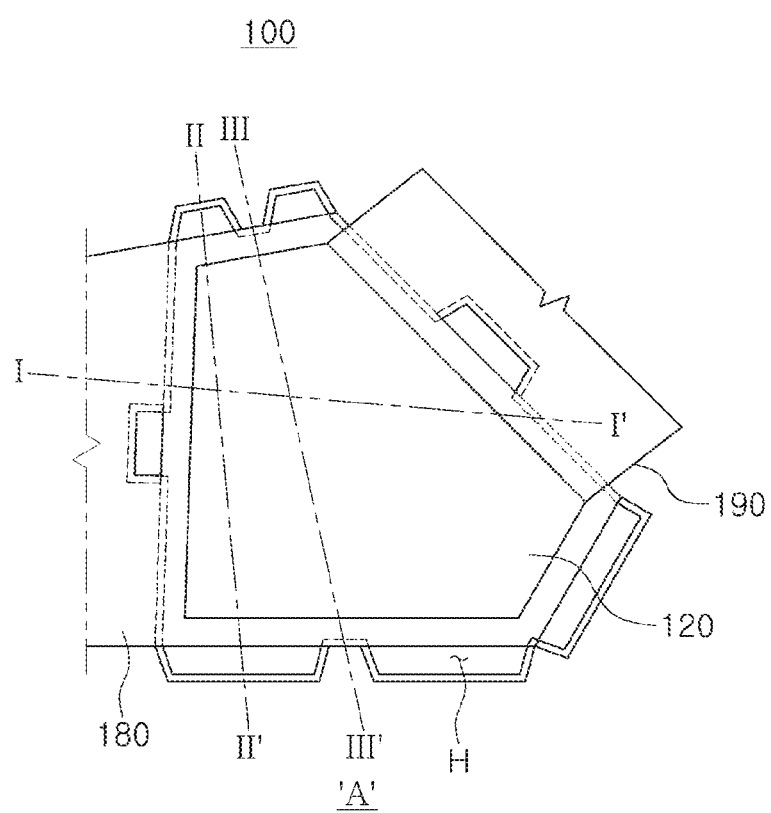
FIG. 1B is a plan view of the example of an acoustic resonator shown in an enlarged view of a portion 'A' of FIG. 1A.
Figure 2:
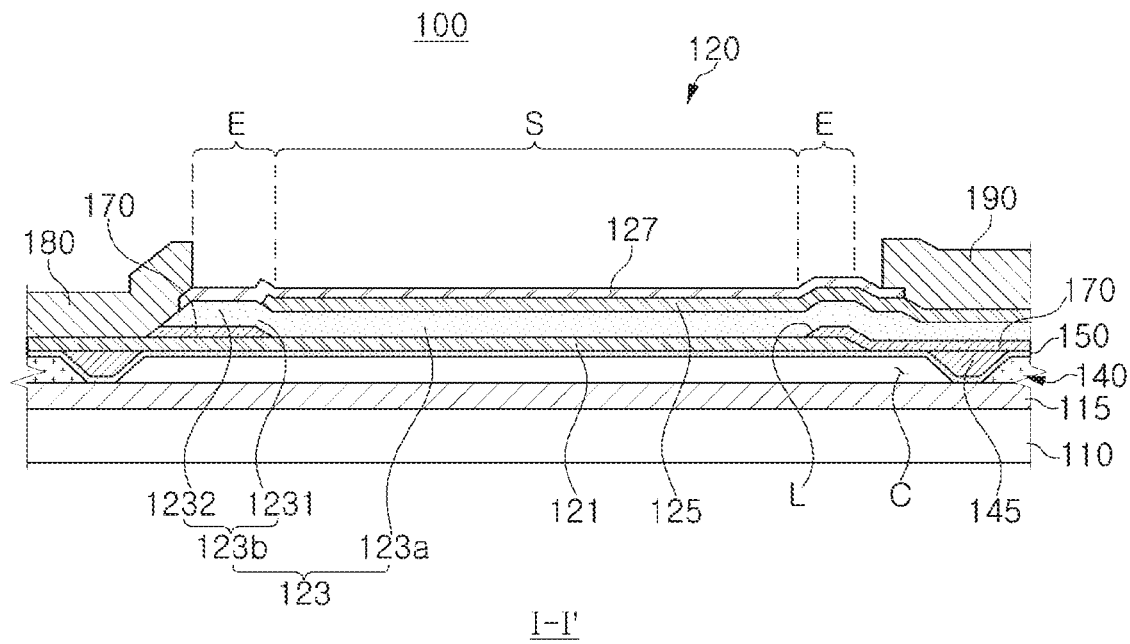
FIG. 2 is a cross-sectional view taken along line I-I' of the example of the acoustic resonator in FIG. 1B.
Figure 3:
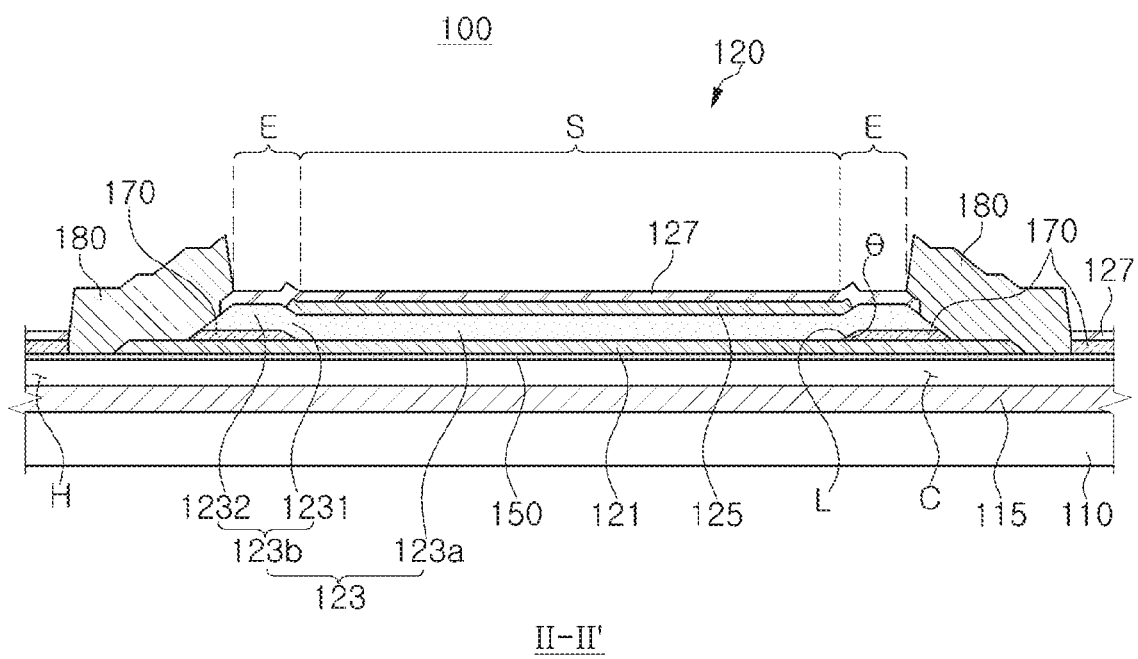
FIG. 3 is a cross-sectional view taken along line II-II' of the example of the acoustic resonator in FIG. 1B.
Figure 4:
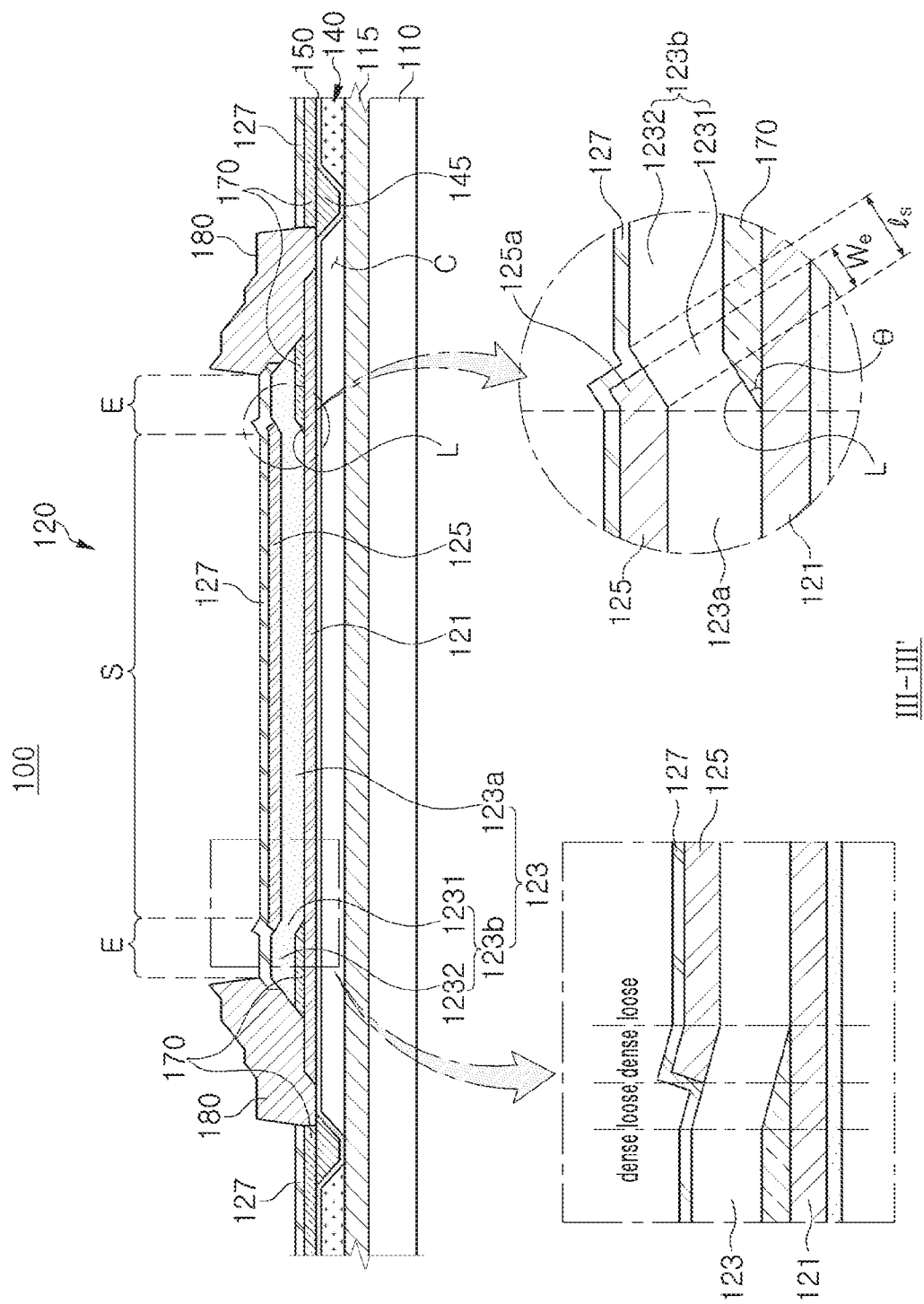
FIG. 4 is a cross-sectional view taken along line III-III' of the example of the acoustic resonator in FIG. 1B.

FIG. 1A is a plan view of an acoustic resonator filter according to an example, and FIG. 1B is a plan view of the acoustic resonator shown in an enlarged view of portion 'A' of FIG. 1A. FIG. 2 is a cross-sectional view taken along line I-I' in FIG. 1B, FIG. 3 is a cross-sectional view taken along line II-II' in FIG. 1B, and FIG. 4 is a cross-sectional view taken along line III-III' in FIG. 1B.

For ease of description, a protective layer 127 (FIG. 2) is not shown in FIGS. 1A and 1B. In respective acoustic resonators 100, 200, and 300 in FIG. 1, only contours of a first electrode 121 and a second electrode 125 are shown.

Referring to FIGS. 1 to 4, an acoustic resonator filter 1 according to an example includes a plurality of acoustic resonators 100, 200, and 300 disposed on a substrate 110. The plurality of acoustic resonators 100, 200, and 300 are electrically connected to each other.

The acoustic resonator 100 may be a bulk acoustic wave (BAW) resonator and may include a substrate 110, a sacrificial layer 140, a resonant portion 120, and an insertion layer 170.

The substrate 110 may be a silicon substrate. For example, a silicon wafer or a silicon-on-insulator (SOI) substrate may be used as the substrate 110.

An insulating layer 115 may be formed on a top surface of the substrate 110 to electrically isolate the substrate 110 and the resonant portion 120 from each other. Additionally, the insulating layer 115 may prevent the substrate 110 from being etched by an etching gas when a cavity C is formed during fabrication of an acoustic resonator.

In an example, the insulating layer 115 may be formed of at least one of silicon dioxide ($SiO_2$), silicon nitride ($Si_3N_4$), aluminum oxide ($Al_2O_3$), and aluminum nitride (AlN) and may be formed on the substrate 110 through any one of chemical vapor deposition, RF magnetron sputtering, and evaporation.

A sacrificial layer 140 may be formed on the insulating layer 115. The cavity C and an etch-stop portion 145 may be disposed inside of the sacrificial layer 140.

The cavity C may be formed as a void and may be formed by removing a portion of the sacrificial layer 140.

As the cavity C is formed in the sacrificial layer 140, the resonant portion 120 may be formed to be entirely flat on the sacrificial layer 140.

The etch-stop portion 145 may be disposed along a boundary of the cavity C. The etch-stop portion 145 is provided to prevent etching from proceeding beyond a cavity region during formation of the cavity C. Accordingly, a horizontal area of the cavity C is defined by the etch-stop portion 145 and a vertical area of the cavity C is defined by a thickness of the sacrificial layer 140.

A side surface of the etch-stop layer 145 may be inclined to prevent an abrupt step being formed at a boundary between the etch-stop layer 145 and the sacrificial layer 140. A lower width of a pattern P formed by the etch-stop layer 145 may be narrowed to prevent dishing.

For example, an angle formed by a bottom surface and a side surface of the etch-stop layer 145 may be between 110 and 160 degrees. A width of the bottom surface of the etch-stop layer 145 may be between 2 and 30 micrometers (μm).

The membrane layer 150 may be disposed on the sacrificial layer 140 to define a thickness (or height) of the cavity C together with the substrate 110. The membrane layer 150 may be formed of a material which is not easily removed during formation of the cavity C.

For example, when a halide-based etching gas such as fluorine (F), chlorine (Cl) or a similar gas is used to remove a portion of the sacrificial layer 140 (e.g., cavity region), the membrane layer 150 may be formed of a material having low reactivity with the etching gas. In an example, the membrane layer 150 may include at least one of silicon dioxide ($SiO_2$) and silicon nitride ($Si_3N_4$).

The membrane layer 150 may include a dielectric layer containing at least one of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) or a metal layer containing at least one of aluminum (Al), nickel (Ni), chromium (Cr), platinum (Pt), gallium (Ga), and hafnium (Hf), but the present example is not limited thereto.

A seed layer (not shown) formed of aluminum nitride (AlN) may be disposed on the membrane layer 150. More specifically, the seed layer may be disposed between the membrane layer 150 and the first electrode 121. The seed layer may be formed of a dielectric or metal having an HCP structure in addition to aluminum nitride (AlN). In the case of a metal, the seed layer may be formed of titanium (Ti).

The resonant portion 120 includes the first electrode 121, a piezoelectric layer 123, and the second electrode 125. The first electrode 121, the piezoelectric layer 123, and the second electrode 125 are sequentially laminated from bottom to top. Accordingly, the piezoelectric layer 123 of the resonant portion 120 is disposed between the first electrode 121 and the second electrode 125.

Since the resonant portion 120 is disposed on the membrane layer 150, the membrane layer 150, the first electrode 121, the piezoelectric layer 123, and the second electrode 125 are sequentially laminated to constitute the resonant portion 120.

The resonant portion 120 may cause the piezoelectric layer 123 to resonate according to a signal applied to the first and second electrodes 121 and 125 to generate a resonant frequency and an antiresonant frequency.

The resonant portion 120 may be divided into a center portion S, in which the first electrode 121, the piezoelectric layer 123, and the second electrode 125 are laminated substantially flat, and extending portions E in which the insertion layer 170 is interposed between the first electrode 121 and the piezoelectric layer 123.

The center portion S is a region disposed in the center of the resonant portion 120, and the extending portions E may be regions disposed along peripheries of the center portion S. Accordingly, the extending portions E may be regions extending outwardly from the center portion S, and refer to a region formed in a continuous annular shape along the periphery of the center portion S. However, the center portion S may be formed in a discontinuous annular shape in which it is partially disconnected, if necessary.

Accordingly, as shown in FIGS. 2 to 4, extending portions E may be disposed at both ends of the center portion S, respectively in a cross-sectional surface where the resonant portion 120 is cut across the center portion S.

The insertion layer 170 may have an inclined surface L which becomes thicker as a distance from the center portion S increases.

In the extending portion E, the piezoelectric layer 123 and the second electrode 125 are disposed on the insertion layer 170. Accordingly, the piezoelectric layer 123 and the second electrode 125 have an inclined surface conforming to a shape of the insertion layer 170.

In the present example, the insertion layer 170 may be entirely disposed at the extending portion E. Accordingly, as shown in FIGS. 2 to 4, the insertion layer 170 is disposed at both the extending portions E disposed at both ends of the center portion S in a cross-sectional surface where the resonant portion 120 is cut across the center portion S.

In the present example, the extending portions E may be defined to be included in the resonant portion 120, and thus resonance may also occur in the extending portion E. However, the occurrence of resonance is not limited thereto. According to a structure of the extending portions E, resonance may occur only in the center portion S and may not occur in the extending portions E.

Each of the first and second electrodes 121 and 125 may be formed of a conductor. For example, each of the first and second electrodes 121 and 125 may be formed of a metal containing at least one of gold, molybdenum, ruthenium, iridium, aluminum, platinum, titanium, tungsten, palladium, tantalum, chromium, and nickel or alloys thereof. However, the material thereof is not limited thereto.

In the resonant portion 120, the first electrode 121 may be formed to have a larger area than the second electrode 125, and a first metal 180 may be disposed on the first electrode 121 along the outer edge of the first electrode 121. Accordingly, the first metal layer 180 may be disposed in the form of surrounding the second electrode 125.

Since the first electrode 121 is disposed on the membrane layer 150, the first electrode 121 may be entirely flat. Meanwhile, since the second electrode is disposed on the piezoelectric layer 123, bending may be formed to correspond to a shape of the piezoelectric layer 123.

According to a placement region, the first electrode 121 may be divided into a portion disposed within the resonant portion 120 and a region disposed outwardly of the resonant portion 120 in the extended portion E. The portion disposed on the outside of the resonant portion 120 may be a connection electrode connected to another adjacent acoustic resonator 300. The portion disposed within the resonant portion 120 is formed to have an entirely asymmetrical polygonal plane.

The second electrode 125 is disposed in the entire region of the center portion S and is partially disposed in the extending portion E. Accordingly, the second electrode 125 may be divided into a portion disposed on a piezoelectric portion 123a of the piezoelectric layer 123 and a portion disposed on an inclined portion 123b of the piezoelectric layer 123. The piezoelectric portion 123a and the inclined portion 123b will be described below.

More specifically, in the present example, the second electrode 125 may be disposed to cover the entirety of the piezoelectric portion 123a and a portion of the inclined portion 1231 of the piezoelectric layer 123. Accordingly, the second electrode 125a disposed in the extending portion E may have a smaller area than an inclined surface of the inclined portion 1232 and, in the resonant portion 120, the second electrode 125 may have a smaller area than the piezoelectric layer 123.

Accordingly, as shown in FIGS. 2 and 4, a tip of the second electrode 125 may be disposed within the extending portion E in the cross-sectional surface where the resonant portion 120 is cut across the center portion S. Additionally, a tip of the second electrode 125 disposed within the extending portion E may be disposed to partially overlap the insertion layer 170. The term "overlap" used herein means that when the second electrode 125 is projected onto a plane on which the insertion layer 170 is disposed, a shape of the second electrode 125 projected onto the plane overlaps a shape of the insertion layer 170.

According to the placement region, the second electrode 125 may also be divided into a portion disposed within the resonant portion 120 and a region outward of the resonant portion 120. The portion disposed on the outside of the resonant portion 120 may be a connection electrode connected to another adjacent acoustic resonator 200.

Since the second electrode 125 is configured to have a shape similar to a shape of the first electrode 121, the portion disposed within the resonant portion 120 is formed to have an entirely asymmetrical polygonal plane.

The piezoelectric layer 123 may be disposed on the first electrode 121 and the insertion layer 170.

As a material of the piezoelectric layer 123, zinc oxide (ZnO), aluminum nitride (AlN), doped aluminum nitride, lead zirconate titanate, quartz, and the like may be selectively used. The doped aluminum nitride may further include a rare earth metal, a transition metal or an alkaline earth metal. For example, the rare earth metal may include at least one of scandium (Sc), erbium (Er), yttrium (Y), and lanthanum (La) and a content of the rare earth metal may be 1 to 20 atomic percent (at %). The transition metal may include at least one of hafnium (Hf), titanium (Ti), zirconium (Zr), tantalum (Ta), and niobium (Nb. The alkaline earth metal may include magnesium (Mg).

The piezoelectric layer 123 may include a piezoelectric portion 123a disposed in the center portion S and a bent portion 123b disposed in the extending portion E.

The piezoelectric portion 123a is a portion directly laminated on a top surface of the first electrode 121. Accordingly, the piezoelectric portion 123a is interposed between the first electrode 121 and the second electrode 125 to be flush with the first electrode 121 and the second electrode 125.

The bent portion 123b may extend outward from the piezoelectric portion 123a to be defined as a region disposed in the extending portion E.

The bent portion 123b may be disposed on the insertion layer 170 and is raised to follow a shape of the insertion layer 170. The piezoelectric layer 123 is bent at a boundary between the piezoelectric portion 123a and the bent portion 123b and is raised to correspond to a thickness and a shape of the insertion layer 170.

The bent portion 123b may be divided into an inclined portion 1231 and an extended portion 1232.

The inclined portion 1231 refers to a portion inclined along the inclined surface L of the insertion layer 170, and the extending portion 1232 refers to a portion extending outwardly from the inclined portion 1231.

The inclined portion 1231 may be disposed parallel to the inclined surface L of the insertion layer 170, and an angle of inclination of the inclined portion 1231 may be the same as an angle of inclination (Θ in FIG. 4) of the inclined surface L of the insertion layer 170.

The insertion layer 170 may be disposed along a surface formed by the membrane layer 150, the first electrode 121, and the etch-stop layer 145.

The insertion layer 170 may be disposed on the periphery of the center portion S to support the bent portion 123b of the piezoelectric layer 123. Accordingly, the bent portion 123b of the piezoelectric layer 123 may be divided into the inclined portion 1231 and the extended portion 1232, conforming to a shape of the insertion layer 170.

The insertion layer 170 is disposed in a region except for the center portion S. For example, the insertion layer 170 is disposed in the entire region except for the center portion S or in a partial region.

Figure 5A:
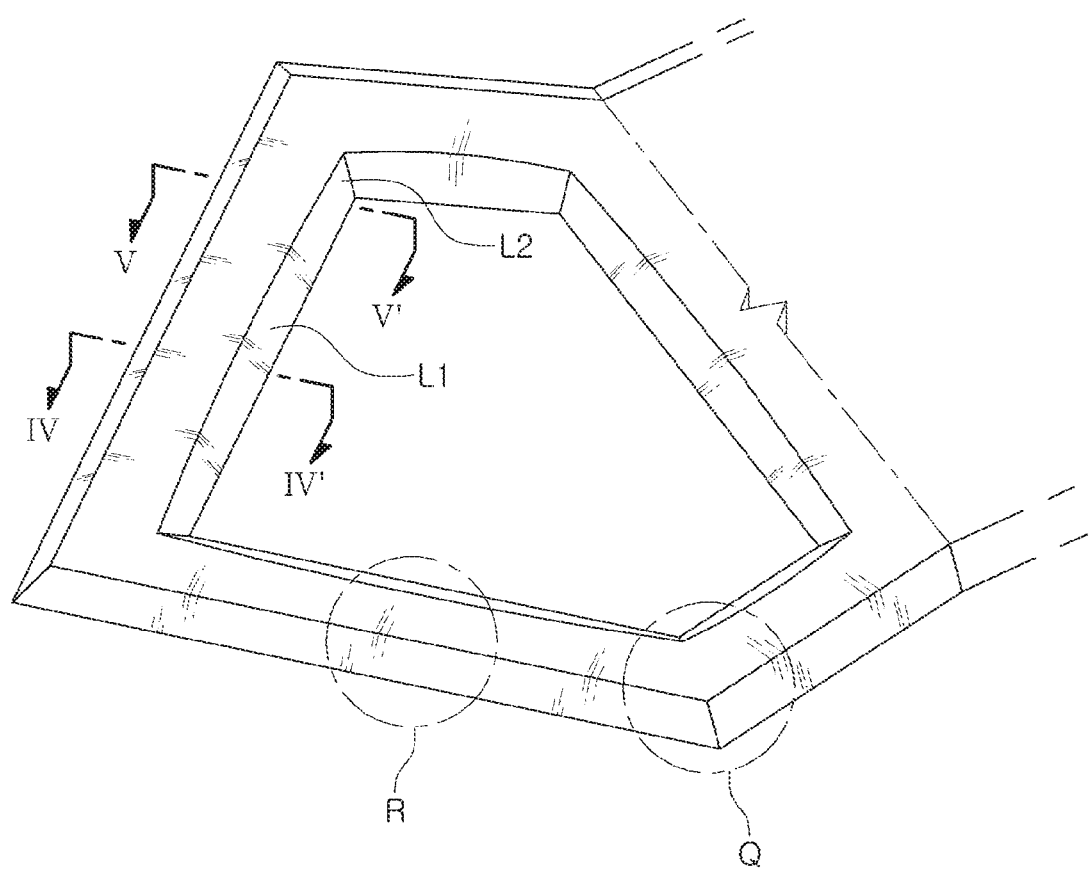
FIG. 5A is a perspective view of an insertion layer shown in the example of the acoustic resonator FIG. 2.
Figure 5B:
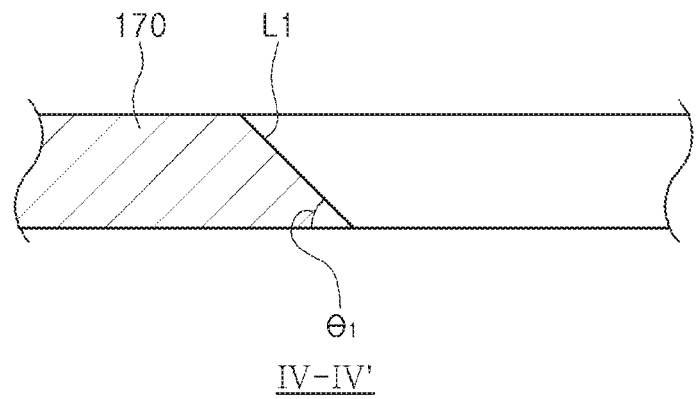
FIG. 5B is a cross-sectional view taken along line IV-IV' of the example of the acoustic resonator in FIG. 5A.
Figure 5C:
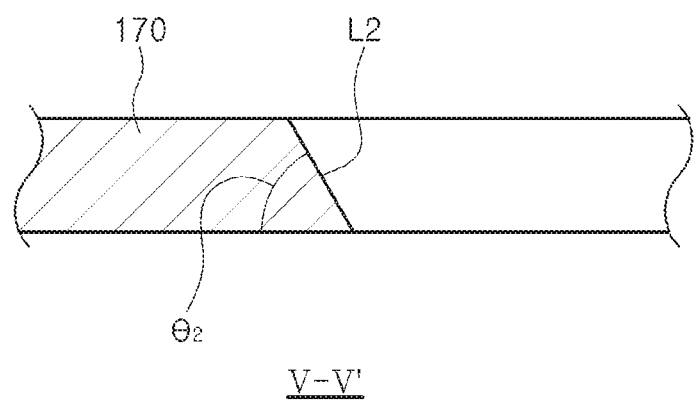
FIG. 5C is a cross-sectional view taken along line V-V' of the example of the acoustic resonator in FIG. 5A.
Figure 5D:
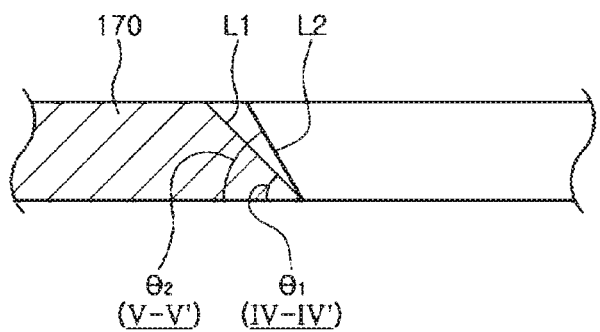
FIG. 5D is a view in which FIG. 5B and FIG. 5C overlap each other.

FIG. 5A is a perspective view of an example of an insertion layer shown in FIG. 2. FIG. 5B is a cross-sectional view taken along line IV-IV' in FIG. 5A, and FIG. 5C is a cross-sectional view taken along line V-V' in FIG. 5A. FIG. 5D is a view in which FIG. 5B and FIG. 5C overlap each other;

The insertion layer 170 may be divided into a portion disposed within the resonant portion 120 and a region disposed outwardly of the resonant portion 120. As shown in FIG. 5A, a portion disposed in the resonant portion 120 of the insertion layer 170 has an asymmetrical polygonal annular shape along a contour of the first electrode 121.

In the present example, the insertion layer 170 disposed in the resonant portion 120 is configured to have a continuous annular shape, as shown in FIG. 5A. However, the present example is not limited thereto. For example, various modifications are possible, such as configuring the insertion layer 170 disposed in the resonant portion 120 in the form of broken lines.

At least a portion of the insertion layer 170 is disposed between the piezoelectric layer 123 and the first electrode 121.

A side surface of the insertion layer 170 disposed along a boundary of the center portion S may become thicker as a distance from the center portion S increases. Thus, the insertion layer 170 is formed in such a manner that a side surface disposed adjacent to the center portion S may be formed as an inclined surface L having a constant angle of inclination Θ. Hereinafter, the angle of inclination Θ will refer to an angle between an inclined surface L of the insertion layer 170 disposed adjacent to the center portion S and a bottom surface of the insertion layer 170.

If the angle of inclination Θ of the insertion layer 170 is narrower than 5 degrees, the insertion layer 170 should be very thin or the inclined surface L should have an excessively large area. Accordingly, there is difficulty in substantially implementing the insertion layer 170 having the angle of inclination Θ less than 5 degrees.

On the other hand, if the angle of inclination Θ of the insertion layer 170 is wider than 70 degrees, the angle of inclination of the inclined portion 1231 of the piezoelectric layer 123 laminated on the piezoelectric layer 170 is also wider than 70 degrees. In this case, since the piezoelectric layer 123 is excessively bent, cracking may occur in the bent portion of the piezoelectric layer 123.

As a result, the inclined surface L may be formed to have an angle of inclination Θ ranging from 5 degrees to 70 degrees.

The insertion layer 170 may be formed of a dielectric material such as silicon oxide ($SiO_2$), aluminum nitride (AlN), aluminum oxide ($Al_2O_3$), silicon nitride (SiN), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), but may be formed of a material different from the material of the piezoelectric layer 123. If necessary, a region in which the insertion layer 170 is provided may be formed as a void, which may be implemented by removing the insertion layer 170 after the resonant portions 120 is completely formed during the manufacturing process.

In the present example, a thickness of the insertion layer 170 may be equal or similar to the thickness of the first electrode 121. Additionally, the thickness of the insertion layer 170 may be similar to or less than the thickness of the piezoelectric layer 123. For example, the thickness of the insertion layer 170 may be more than or equal to 100 angstroms (Å) to easily adjust a deposition thickness and to ensure uniformity of thickness in a deposited wafer. Additionally, the thickness of the insertion layer 170 may be less than the thickness of the piezoelectric layer 123. For this reason, an inclined portion of the piezoelectric layer 123 may be formed due to the insertion layer 170 and a crack may be prevented from occurring, which may contribute to a performance improvement of the acoustic resonator.

The above-configured resonant portion 120 is disposed to be spaced apart from the substrate 110 through the cavity C formed as a void.

The cavity C may be formed by supplying an etching gas (or an etching solution) to an introduction hole (H in FIGS. 1B and 3) to remove a portion of the sacrificial layer 140 during the manufacturing process.

The protective layer 127 may be disposed along a surface of the acoustic resonator 100 to protect the acoustic resonator 100 from external elements. The protective layer 127 may be disposed along a surface formed by the second electrode 125, the bent portion 123b of the piezoelectric layer 123, and the insertion layer 170.

The protective layer 127 may be formed of one of silicon oxide-based, silicon nitride-based, aluminum oxide-based, and aluminum nitride-based insulating materials, but the insulating material is not limited thereto.

Each of the first electrode 121 and the second electrode 125 includes a connection electrode extending outwardly of the resonant portion 120. A first metal layer 180 is disposed on a top surface of the connection electrode of the first electrode 121, and a second metal 190 is disposed on a top surface of the connection electrode of the second electrode 125.

Each of the first and second metal layers 180 and 190 may be formed of gold (Au), gold-tin (Au—Sn) alloy, copper (Cu), copper-tin (Cu—Sn) alloy, aluminum (Al), aluminum-germanium (Al—Ge) alloy or the like.

The first and second metal layers 180 and 190 disposed above the connection electrodes may function as connection wirings configured to electrically connect electrodes of another acoustic resonator disposed adjacent to the first and second electrodes 121 and 125 of the acoustic resonator 100 or external connection terminals. However, the functions of the first and second metal layers 180 and 190 are not limited thereto.

Although a structure in which the insertion layer 170 is disposed below the second electrode 125 is shown in FIG. 2, the present example is not limited thereto. If necessary, a structure in which the insertion layer 170 is removed below the second electrode 125 may be implemented.

The first metal layer 180 is bonded to the first electrode 121 through the insertion layer 170 and the protective layer 127.

As shown in FIG. 3, the first electrode 121 may have a larger area than the second electrode 125 and the first metal

180 may also be disposed on a periphery of the first electrode 121 disposed outwardly of the electrode 125.

Accordingly, the first metal layer 180 may be disposed along the periphery of the resonant portion 120 to surround the second electrode 125, but the position thereof is not limited thereto.

As mentioned above, the second electrode 125 is laminated on the piezoelectric portion 123a and the inclined portion 1231 of the piezoelectric layer 123. A portion (125a in FIG. 4) of the second electrode 125 disposed on the inclined portion 1231 of the piezoelectric layer 123 is only disposed on a portion of the inclined surface of the inclined portion 1231 rather than on the entire surface of the inclined portion 1231.

Figure 20:
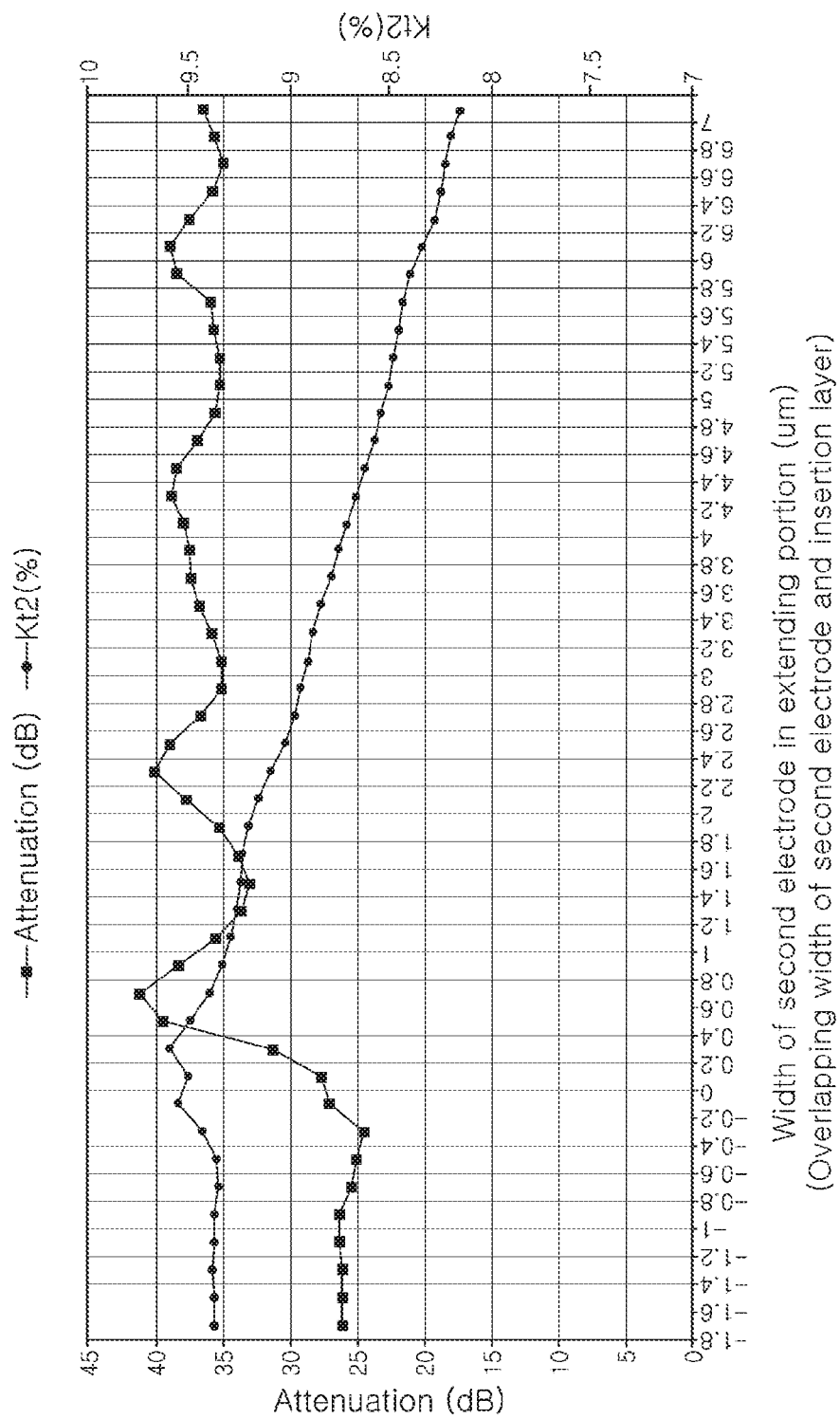
FIG. 20 is a graph illustrating resonance performance of an acoustic resonator depending on a second electrode structure of an acoustic resonator according to an example.

FIG. 20 is a graph illustrating resonance performance of an acoustic resonator depending on a second electrode structure of an acoustic resonator according to an example, and FIG. 21 is a table drawn by summarizing values of the graph in FIG. 20.

An acoustic resonator used in the measurement was an acoustic resonator illustrated in FIGS. 2 to 4, a thickness of the insertion layer 170 was 3000 Å, an angle of inclination Θ of the inclined surface L of the insertion layer 170 was 20 degrees, and a length (or width) Is of the inclined surface L was 0.87 µm.

In the present example, an inclined surface of the piezoelectric layer 123 is disposed in the same shape along the inclined surface of the insertion layer 170. Therefore, a length of the inclined surface of the piezoelectric layer 123 may be regarded as being equal to the length Is of the inclined surface L of the insertion layer 170.

FIG. 20 is a graph illustrating measured attenuation of above-described acoustic resonator while varying a width We of the second electrode 125a (FIG. 4) disposed in the extending portion E of the acoustic resonator.

In FIG. 20, y-axis represents attenuation of the acoustic resonator. In the present example, the expression "the attenuation of the acoustic resonator is great" means that loss caused by propagation of a lateral wave to an outer edge of the resonance unit 120 is less and, in conclusion, means that performance of the acoustic resonator is improved.

X-axis represents a width We of the second electrode 125a (FIG. 4) disposed in the extending portion E of the acoustic resonator. Accordingly, each positive-integer interval on the x-axis refers to a width of an overlapping portion of the second electrode 125a (FIG. 4) and the insertion layer 170 in the extending portion E, and each negative-integer interval on the y-axis refers to a horizontal distance at which the second electrode 125a (FIG. 4) is spaced apart from the insertion layer 170 (or the extending portion E). Here, zero micrometers (0 µm) refers to a state in which the second electrode 125a (FIG. 4) and the insertion layer 170 do not overlap and tips are disposed along the same boundary.

In FIG. 20, Kt2(%) values of the acoustic resonator depending on the width We of the second electrode 125a are also shown. The Kt2(%) indicates piezoelectric characteristics depending on each resonant portion structure.

Figure 13:
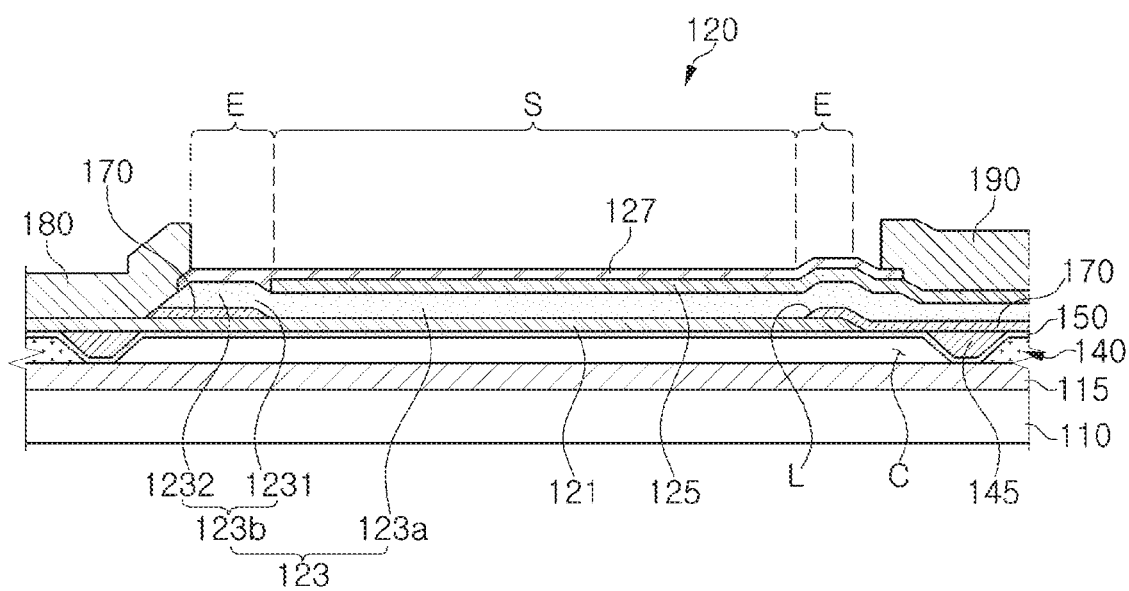

Referring to FIGS. 20 and 21, it can be appreciated that attenuation characteristics increase as an X-axis value increases, on the basis of a configuration in which a tip of the second electrode 125 is disposed along the same boundary as the insertion layer 170 (0 µm, the configuration in FIG. 13). Meanwhile, it can be appreciated that when a distance of the second electrode 125 from the insertion layer 170 increases as the x-axis value decreases, attenuation is reduced to degrade characteristics of the acoustic resonator.

This is a result obtained as reflection performance of the lateral wave in the extending portion E increases. As shown in FIG. 4, when the second electrode 125 is disposed above the inclined surface of the insertion layer 170, an acoustic impedance of the resonant portion 120 increases a reflection interface on which a lateral wave is reflected inwardly of the resonant portion 120 because a local structure may have a loose/dense/loose/dense structure. As a result, most of the lateral waves do not propagate outwardly of the resonant portion 120 and are reflected inwardly of the resonant portion 120 to improve attenuation characteristics.

In an acoustic resonator in which the length Is of the inclined surface of the piezoelectric layer 123 in the extending portion is 0.87 µm, when the second electrode 125a having a width of 0.4 to 8 µm is laminated on the inclined surface of the piezoelectric layer 123, a high level of attenuation may occur. Accordingly, a significant reduction of losses caused when the lateral wave propagates outwardly of the resonant portion 120 may result. In addition, when the width We of the second electrode 125a is greater than, or smaller than, the above-mentioned width in the extending portion E, attenuation may be reduced and degrade resonance performance.

In consideration of a ratio of the width we of the second electrode 125 to the inclined surface length Is (We/Is) in the extending portion E, as illustrated in Table (1), the attenuation may be maintained above 38 dB when the ratio (we/Is) is 0.46 to 0.92.

Accordingly, to secure the resonance performance, a ratio of a maximum width We of the second electrode 125a to an inclined surface length Is (We/Is) in the extending portion E of the acoustic resonator 100 according to the present example may be limited within a range of 0.46 to 0.92. All the configurations of the present disclosure are not limited to the range of 0.46 to 0.92, and the range may vary depending on variation in size of an angle of inclination Θ or thickness of the insertion layer 170.

In the example where the second electrode 125 is disposed in the entire extending portion E over the inclined portion 1231 of the piezoelectric layer 123a (see FIG. 12), peaks of attenuation may emerge when the width We of the second electrode 125 in the extending portion E is 2.2 µm, 4.2 µm, and 6 µm, respectively (see FIG. 20).

As illustrated in FIG. 20, the larger an overlapping area of the second electrode 125 and the insertion layer 170, the smaller a Kt2(%) value of an acoustic resonator, which may be caused as an inefficient area formed by the insertion layer 170 increases.

Accordingly, an overlapping region of the insertion layer 170 and the second electrode 125 may be varied for each acoustic resonator to implement a Kt2(%) value differently for each acoustic resonator. As a result, there may be an increase in the variety or degree of filter designs.

As shown in FIG. 1, when two acoustic resonators (hereinafter referred to as a first resonator and a second resonator), according to an example, are disposed adjacent to each other, a first resonator 100 and a second resonator 200 may be disposed in such a manner that different sides of a polygon face each other.

Facing sides of the first resonator 100 and the second resonator 200 may be disposed in parallel with each other, but the present disclosure is not limited thereto. For example, although facing sides of the first resonator 100 and the second resonator 200 are not parallel to each other, the facing sides may be disposed as close as possible to each other within a range in which they do not contact or interfere with each other.

Likewise, the resonant portion 120 may be formed to have a polygonal plane, which may allow a spacing distance between the acoustic resonators 100 and 200 to be significantly reduced.

When a resonant portion 120 of an acoustic resonator is configured to have a circular or elliptical plane, an empty space between two acoustic resonators disposed adjacent to each other increases, and thus, an entire region occupied by the two acoustic resonators also increases. However, similarly to the present example, when the resonant portion 120 is configured to have a polygonal plane, facing sides of the first resonator 100 and the second resonator 200 may be disposed adjacent to each other. Thus, an empty space between the two acoustic resonators 100 and 200 may be significantly reduced.

Moreover, an area on the substrate 110 occupied by the first resonator 100 and the second resonator 200 may also be significantly reduced.

As the resonant portion 120 is configured to have an asymmetrical polygonal plane, the insertion layer 170 of the present example may also be configured to have an asymmetrical polygonal annular shape.

In the present example, the term "asymmetrical polygon" refers to a polygon that is not symmetrical with respect to a point within a polygon, a polygon that is not symmetrical with respect to a line passing through the polygon, or a polygon whose facing sides are not parallel to each other.

The acoustic resonator 100 according to the present example is configured in such a manner that an entire plane of the resonant portion 120 has a shape of an asymmetrical polygon. Thus, the contour of the resonant portion 120 has at least three vertices and at least three sides, when viewed in a plan view.

When the contour of the resonant portion 120 has three vertices and three sides, an included angle of the sides may be less than 90 degrees, i.e., an acute angle. When the contour of the resonant portion 120 includes four vertices and four sides, at least one included angle is an acute angle. When the included angle is an acute angle, an acoustic wave reflected at the edge of the resonant portion 120 may cause more interference than an acoustic wave reflected at the side of the resonant portion 120, to increase loss. To reduce loss caused by the acute angle, vertices forming the acute angle may be chamfered to form an obtuse angle.

An acoustic resonator according to an example may be configured in such a manner that a contour of the resonant portion 120 has a pentagonal shape including five or more vertices and five or more sides. Thus, the above-mentioned loss may be significantly reduced. When the contour of the resonant portion 120 is implemented to have a pentagonal shape, all included angles of sides are formed as obtuse angles to easily implement a shape of each layer. However, the shape of the resonant portion 120 of the acoustic resonator 100 is not limited thereto. As shown in FIG. 1A, if a portion of the resonant portion 120 has an asymmetrical polygonal shape, the resonant portion 120 may be configured to have various shapes.

In the present example, a vertex is basically configured to have an angular shape but, if necessary, may be configured to have a rounded vertex shape or a chamfered shape during a process and a manufacturing process.

As the resonant portion 120 may be configured to have a pentagonal shape, the insertion layer 170 also includes four vertices Q and five sides R, as shown in FIG. 5A.

As shown in FIGS. 5A to 5D, the insertion layer 170 may be configured in such a manner that an angle of inclination $\Theta1$ on a side R is different from an angle of inclination $\Theta2$ at a portion of a vertex Q (e.g., included angle). More specifically, the insertion layer 170 may be configured in such a manner that the angle of inclination $\Theta2$ is greater than the center portion angle of inclination $\Theta1$ of the side R.

In the acoustic resonator 100, interference of lateral acoustic waves increases at the vertex Q of the resonant portion 120. Thus, an angle of the inclined surface L of the insertion layer 170 is increased at the vertex Q of the resonant portion 120 to enhance reflection characteristics at the vertex Q of the resonant portion 120.

Since an acoustic impedance difference increases in the extending portion E as an angle of inclination ($\Theta$ in FIG. 4) of the insertion layer 170 increases, reflection characteristics of a lateral wave in the extending portion E are enhanced.

However, when the angle $\Theta$ of the insertion layer 170 increases excessively, the piezoelectric layer 123 laminated on the insertion layer 170 may be excessively bent to cause cracking at the bent portion of the piezoelectric layer 123. Since a width of the inclined surface L is narrowed as the angle of inclination $\Theta$ increases, it may be difficult to accurately place the second electrode 125 within the extending portion E while forming the second electrode 125 on the piezoelectric layer 123.

Accordingly, the center portion angle of inclination $\Theta1$ of the side R may be configured to be relatively narrow at the insertion layer 170 disposed in the resonant portion 120 and the angle $\Theta2$ of the insertion layer 170 may be configured to be relatively wide at a vertex at which an interference of the lateral acoustic waves increases. As a result, loss of the lateral acoustic waves is reduced.

As shown in FIGS. 5B and 5D, sides R constituting the insertion layer 170 are configured in such a manner that the angle of inclination $\Theta$ increases as a distance from the vertex Q decreases. Thus, the sides R constituting the insertion layer 170 are configured in such a manner that the center portion angle of inclination $\Theta1$ and the angle of inclination $\Theta2$ of both tips (i.e., a vertex portion) are different from each other.

For example, the angle of inclination $\Theta1$ of the side R and the angle of inclination $\Theta2$ of both tips of the side R may be configured to be different by 5 degrees or more. As mentioned above, the angle of inclination $\Theta$ of the insertion layer 170 may be in a range of 5 to 70 degrees. Accordingly, when the center portion angle of inclination $\Theta1$ of the side R and the angle of inclination $\Theta2$ of both tips of the side R are configured to be different by 5 degrees or more, the angle of inclination $\Theta2$ of the vertex Q may be defined to be within a range of 10 to 70 degrees and the center portion angle of inclination $\Theta1$ of the side R may be defined to be in a range of 5 to 65 degrees. However, the present example is not limited thereto.

When the angle of inclination $\Theta2$ at the vertex R is configured to be greater than the center portion angle of inclination of the side R, loss of acoustic energy may be reduced. This will be described below in detail.

Figure 22:
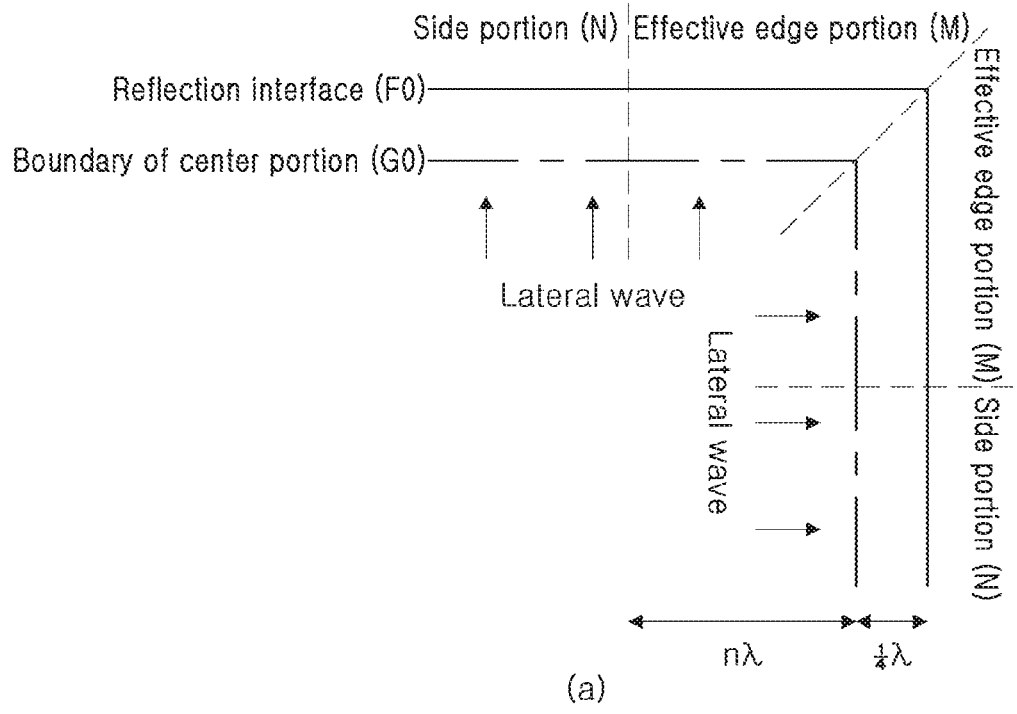
FIGS. 22 and 23 illustrate effects of an acoustic resonator according to an example.
Figure 22:
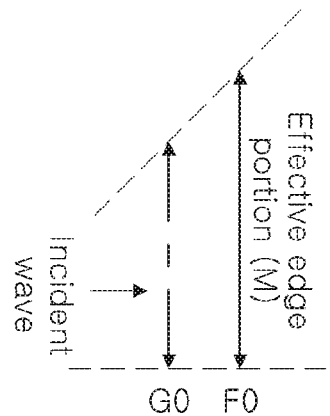
Figure 23:
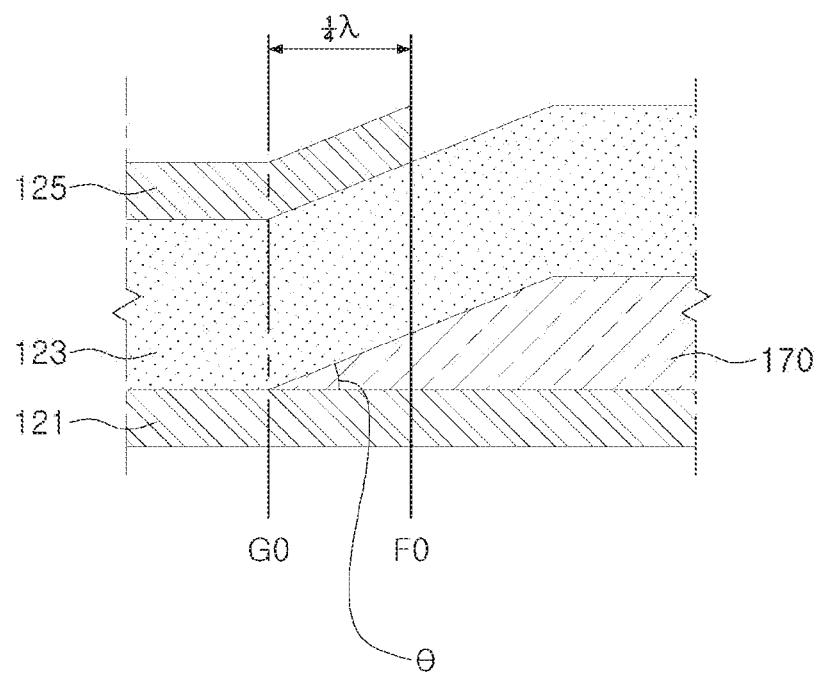

FIGS. 22 and 23 illustrate effects of an acoustic resonator according to an example. FIG. 22 shows a plan at a vertex of the resonant portion 120 and shows that a lateral wave is incident to the extending portion E near the vertex of the center portion S. FIG. 23 shows a partial cross section of the extending portion E of the acoustic resonator.

Although FIG. 22 shows that an included angle of a vertex of the resonant portion 120 is a right angle, the present example is not limited thereto.

Referring to FIGS. 22 and 23, the acoustic resonator may be divided into an effective edge portion M and a side portion N. The effective edge portion M is a region affected by interference between components of a lateral wave having different propagation directions, and a side portion N is a region which is not affected by the interference. In the acoustic resonator according to an example, a reflection interface F0 is mounted in the extending portion E to achieve good reflection of the lateral waves. The reflection interface may be, for example, a vertical surface formed along a tip of the second electrode 125.

A preferable width between a center boundary (interface between a center portion and an extending portion) G0 and the reflection interface F0 is about a quarter of a wavelength λ of a lateral wave, which is aimed at realizing Bragg reflection of the lateral wave. A boundary between the effective edge portion M and the side portion N may be defined as a position spaced n times a wavelength apart from the edge of a center boundary. It is appropriate that n=1 in a resonance mode of the lateral wave to form a lattice pattern, in which one wavelength (1λ) is given as a pitch, in the center portion S.

Referring to FIG. 22, in the effective edge portion M, an interface length of the center boundary G0 is nẽ and a length of the reflection interface F0 is (n+¼) λ. Therefore, a ratio of the interface length of the center boundary G0 to the length of the reflection interface F0 is n:(n+¼). In the side portion N, a ratio of a length of the center boundary G0 to a length of the reflection interface F0 is one to one (1:1). Therefore, reflection behavior of the lateral wave is different in the effective edge portion M and the side portion N.

In a boundary (or interface) in which a shape or a structure are discontinuously formed, transmission and reflection characteristics of a lateral wave are determined by a difference in acoustic impedance z between an incident side and a transmission side. The greater an acoustic impedance difference ΔZ, the less the acoustic energy loss of an acoustic resonator. The acoustic impedance for the lateral wave is in proportion to a thickness and is in inverse proportion to an interface length. Since the reflection interface M0 has a greater length than the center boundary G0 in the effective edge portion M, the acoustic impedance difference ΔZ between the center boundary G0 and the reflection interface F0 in the effective edge portion M becomes smaller than that in the side portion N. Thus, the reflection characteristics of the lateral wave are degraded in the effective edge portion M, as compared to those in the side portion N.

Accordingly, the acoustic impedance difference ΔZ in the effective edge portion M should be secured, at least as much as that in the side portion N. Since the acoustic impedance difference is in proportion to a thickness and is in inverse proportion to an interface length, the acoustic impedance difference ΔZ in the effective edge portion M is secured by increasing a thickness difference of the effective edge portion M.

In a cross-sectional view (FIG. 23) of a thickness direction including a center boundary G0 and a reflection interface F0, a thickness difference ΔT of the reflection interface F0 is expressed as (¼)λ·(tan Θ). Accordingly, a thickness difference in the side portion N (ΔT_side) and a thickness difference in the effective edge portion M (ΔT_edge) may be calculated using Equation (1) and Equation (2), $$\Delta T\_side=(¼)\lambda \cdot (\tan \Theta 1) \quad \text{Equation (1):}$$

$$\Delta T\_edge=(¼)\lambda \cdot (\tan \Theta 2) \quad \text{Equation (2):}$$

where Θ1 denotes an angle of inclination of the insertion layer 170 in the side portion N and Θ2 denotes an angle of inclination of the insertion layer 170 in the effective edge portion M.

The angle of inclination Θ2 of the effective edge portion M should be greater than the angle of inclination Θ1 of the side portion N to increase a thickness difference. For example, a ratio of the thickness difference of the effective edge portion M to the thickness difference of the side portion N may increase more than a ratio of increase in the interface length of the effective edge portion M to the side portion N. Since a ratio of the length of the center boundary G0 to the length of the reflection interface F0 is n:(n+¼), Equation (3) may be obtained by combining the length ratio with the Equations (1) and (2) in relation to the angle of inclination Θ2 of the effective edge portion M and the angle of inclination Θ1 of the side portion N.

$$\tan \Theta 2/\tan \Theta 1 \le (n+¼)/n \quad \text{Equation (3):}$$

Since n denotes an integral multiple of a wavelength of an acoustic wave, Θ2 may be calculated as shown in Table (1) according to n when Θ1 is 30 degrees.

TABLE (1)

|  | N | | | |
| --- | --- | --- | --- | --- |
|  | 0.5 | 1 | 2 | 4 |
| Θ2 (lower limit) | 40.9° | 35.8° | 33.0° | 31.5° |

Accordingly, to secure the acoustic impedance difference ΔZ of the effective edge portion M, Θ2 should be greater than or equal to 35.8 degrees when n=1. As a result, to obtain the above-described effects, Θ1 and Θ2 should be configured to have a difference of 5 degrees or more when n=1.

Hereinafter, a method of fabricating an acoustic resonator according an example will be described below.

Figure 6:
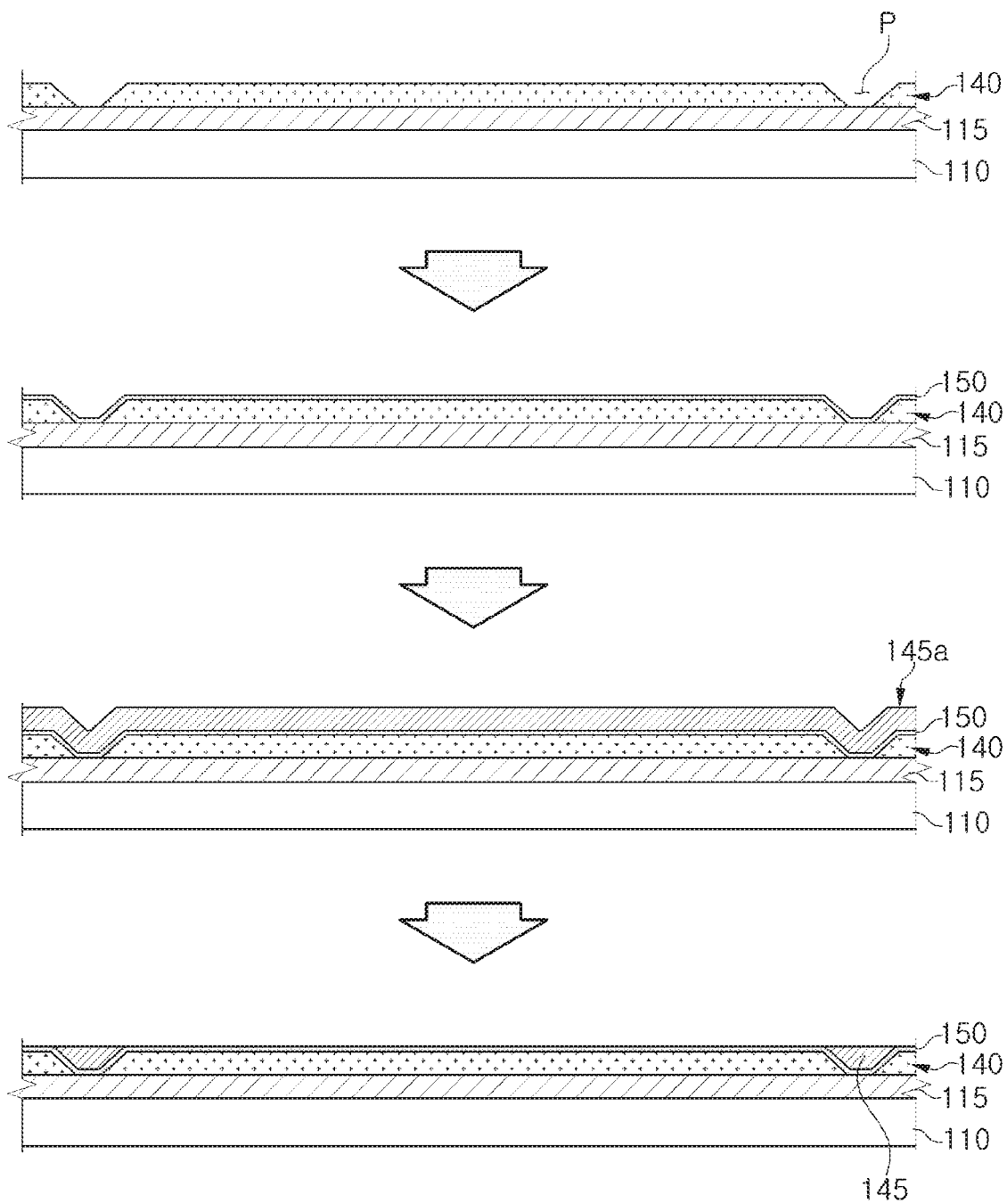
FIGS. 6 to 8 illustrate a method of fabricating an acoustic resonator according to an example.
Figure 7:
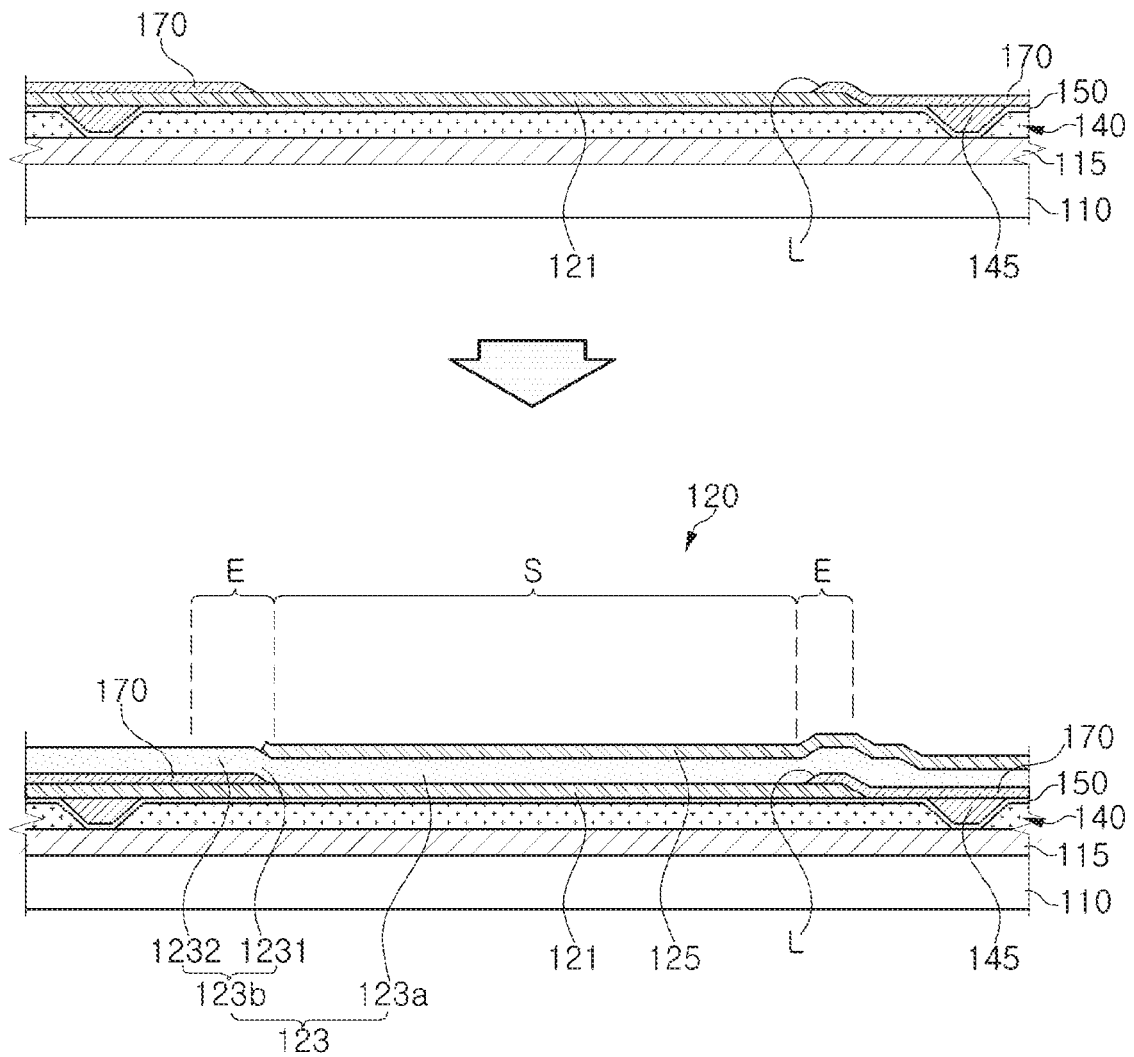
Figure 8:
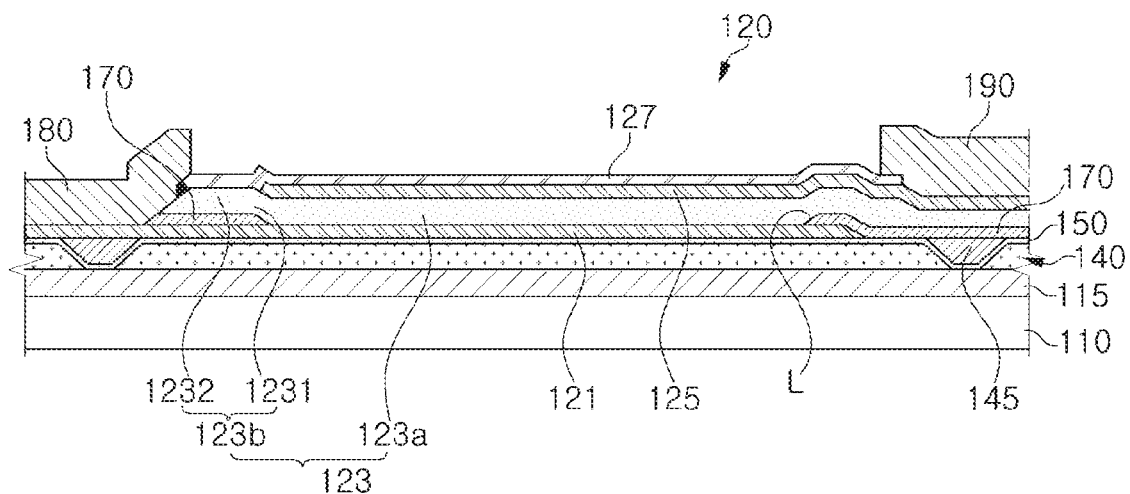

FIGS. 6 to 8 illustrate a method of fabricating an acoustic resonator according to an example.

Referring to FIG. 6, an insulating layer 115 and a sacrificial layer 140 are formed on a substrate 110. A pattern P is formed to penetrate the sacrificial layer 140. Thus, the insulating layer is exposed outwardly through the pattern P.

The insulating layer 115 may be formed of magnesium oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), zinc oxide (ZnO), silicon nitride (SiN) or silicon oxide (SiO$_2$), but the present example is not limited thereto.

The pattern P is formed on the sacrificial layer 140 such that a side surface of the pattern P is inclined to prevent an abrupt step from being formed on a boundary between an etch-stop layer 145 and a sacrificial layer 140 which will be formed in the pattern P later. Additionally, the pattern P may be formed to have a trapezoidal shape in which a width of a top surface is more than a width of a bottom surface to prevent dishing from occurring. As an example, angles formed by the bottom surface and the side surface of the pattern P may be between 110 and 160 degrees and the bottom surface of the pattern P may be formed to have a width of 2 to 30 μm.

A portion of the sacrificial layer 140 is removed through a subsequent etching process to form a cavity C (FIG. 2). Thus, the sacrificial layer 140 may be formed of a material, such as polysilicon or polymer, which is easily etched. However, the present example is not limited thereto.

A membrane 150 is formed on the sacrificial layer 140. The membrane layer 150 is formed to have a constant thickness along a surface of the sacrificial layer 140. The thickness of the membrane 150 may be less than the thickness of the sacrificial layer 140.

The membrane layer 150 may include at least one of silicon dioxide ($SiO_2$) and silicon nitride ($Si_3N_4$). Also the membrane layer 150 may include a dielectric layer containing at least one of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) or a metal layer containing at least one of aluminum (Al), nickel (Ni), chromium (Cr), platinum (Pt), gallium (Ga), and hafnium (Hf), but the present example is not limited thereto.

Although not shown, a seed layer may be formed on the membrane layer 150.

The seed layer may be disposed between the membrane layer 150 and a first electrode 121 which will be described later. The seed layer may be formed of aluminum nitride (AlN), but the present example is not limited thereto. The seed layer may be formed using a dielectric or metal having an HCP structure. For example, in the example that the seed layer is formed of a metal, the seed layer may be formed of titanium (Ti).

An etch-stop layer 145*a* is formed on the membrane layer 150. The etch-stop layer 145*a* also fills in the pattern P.

The etch-stop layer 145*a* may be formed to have a thickness enough to completely fill the pattern P. Accordingly, the etch-stop layer 145*a* may be formed to be thicker than the sacrificial layer 140.

The etch-stop layer 145*a* may be formed of the same material as the insulating layer 115, but the present example is not limited thereto.

The etch-stop layer 145*a* is removed such that the membrane layer 150 is exposed outwardly.

In this example, a filled portion remains in the pattern P, and a remaining etch-stop layer 145*a* functions as an etch-stop layer 145.

As shown in FIG. 7, the first electrode 121 may be formed on a top surface of the membrane layer 150.

The first electrode 121 may be formed of a conductive material such as gold, molybdenum, ruthenium, iridium, aluminum, platinum, titanium, tungsten, palladium, tantalum, chromium, nickel or a metal containing at least one thereof. However, the present example is not limited thereto.

The first electrode 121 may be formed above a region in which a cavity C (FIG. 3) is to be formed.

The first electrode 121 may be formed by forming a conductive layer to cover the entire membrane layer 150 and removing an unnecessary portion.

In this stage, the first electrode 121 includes a region disposed within the resonant portion 120 and a connection electrode disposed in a direction that is external to the resonant portion 120. An entire plane of the region disposed within the resonant portion 120 may have an asymmetrical polygonal shape.

Then an insertion layer 170 is formed. The insertion layer 170 is formed on the first electrode 120 and, if necessary, may extend onto the membrane layer 150.

The insertion layer 170 may be completed by removing a portion disposed in a region corresponding to the center portion S after being formed to cover the entire surface formed by the membrane layer 150, the first electrode 121, and the etch-stop layer 145.

Accordingly, a center portion of the first electrode 121 constituting the center portion S is exposed outwardly of the insertion layer 170. The insertion layer 170 may be formed to cover a portion of the first electrode 121 along a periphery of the first electrode 121. Thus, the insertion layer 170 may be disposed only in an extending portion E within the resonant portion 120, and an outer edge portion of the first electrode 121 may be disposed below a portion of the insertion layer 170.

The insertion layer 170 disposed in the extending portion E may have a shape of an asymmetrical polygonal ring having a plurality of sides and a plurality of vertices, conforming to a shape of the first electrode 121. However, the insertion layer 170 disposed in the extending portion E may have a discontinuous annular shape in which a partial region is disconnected, if necessary.

A side surface of the insertion layer 170 disposed adjacent to the center portion S may be formed as an inclined surface L. The insertion layer 170 becomes thinner as a distance from a side of the center portion S decreases. Thus, a bottom surface of the insertion layer 170 is formed to further extend to the center portion S than a top surface of the insertion layer 170. In this case, an angle of inclination of the inclined surface L of the insertion layer 170 may be in a range of 5 to 70 degrees, as described above.

As shown in FIGS. 5A to 5D, the inclined surface L of the insertion layer 170 may be formed in such a manner that an angle of inclination $\Theta 1$ at the center of a side is greater than an angle of inclination $\Theta 2$ at a portion of a vertex.

The insertion layer 170 may be formed of, for example, a dielectric such as silicon oxide ($SiO_2$), aluminum nitride (AlN), aluminum oxide ($Al_2O_3$), silicon nitride (SiN), magnesium oxide (MgO), zirconium oxide ($ZrO_2$), lead zirconate titanate (PZT), gallium arsenic (GaAs), hafnium oxide ($HfO_2$), titanium oxide ($TiO_2$), zinc oxide (ZnO) or the like, but is formed of a material different from a material of a piezoelectric layer 123.

The piezoelectric layer 123 may be formed on the first electrode 121 and the insertion layer 170.

In the present example, the piezoelectric layer 123 may be formed of aluminum nitride (AlN). However, the present example is not limited thereto. Zinc oxide (ZnO), doped aluminum nitride, lead zirconate titanate (PZT), quartz or similar materials may be selectively used as a material of the piezoelectric layer 123. The doped aluminum nitride may further include a rare earth metal, a transition metal or an alkaline earth metal. For example, the rare earth metal may include at least one of scandium (Sc), erbium (Er), yttrium (Y), and lanthanum (La) and a content of the rare earth metal may be 1 to 20 atomic percent (at %). The transition metal may include at least one of hafnium (Hf), titanium (Ti), zirconium (Zr), tantalum (Ta), and niobium (Nb). The alkaline earth metal may include magnesium (Mg).

The piezoelectric layer 123 may be formed of a material different from a material of the insertion layer 170.

The piezoelectric layer 123 may be formed by removing an unnecessary portion after forming a piezoelectric material on an entire surface formed by the first electrode 121 and the insertion layer 170. In the present example, the piezoelectric layer 123 is completed by removing an unnecessary portion of a piezoelectric material after forming the second electrode 125. However, the present example is not limited thereto and the piezoelectric layer 123 may be completed before forming the second electrode 125.

The piezoelectric layer 123 may be formed to cover at least a portion of the first electrode 121 and at least a portion of the insertion layer 170. In this regard, the piezoelectric layer 123 may be formed to conform to a shape of a surface formed by the first electrode 121 and the insertion layer 170.

As mentioned above, only a portion of the first electrode 121 corresponding to the center portion S is exposed outwardly of the insertion layer 123. Thus, the piezoelectric layer 123 formed on the first electrode 121 is disposed within the center portion S and a bent portion 123b formed on the insertion layer 170 is disposed within the extending portion E.

Since the bent portion 123b is formed to conform to the shape of the insertion layer 170, similarly to the insertion layer 170, an angle of inclination of a portion formed on a vertex of the insertion layer 170 may be greater than an angle of inclination of a portion formed on a side of the insertion layer 170.

The second electrode 125 may be formed on the piezoelectric layer 123. In the present example, the second electrode 125 may be formed of a conductor such as molybdenum (Mo), ruthenium (Ru), iridium (Ir), aluminum (Al), platinum (Pt), titanium (Ti), tungsten (W), palladium (Pd), tantalum (Ta), chromium (Cr), nickel (Ni) or a metal containing at least one thereof, but the present example is not limited thereto.

The second electrode 125 is basically formed on the piezoelectric portion 123a of the piezoelectric layer 123. As mentioned above, the piezoelectric portion 123a of the piezoelectric layer 123 is disposed within the center portion S. Accordingly, the second electrode 125 disposed on the piezoelectric layer 123 is also disposed within the center portion S.

In the present example, a portion of the second electrode 125 may also be formed on an inclined portion 1231 of the piezoelectric layer 123. Accordingly, the second electrode 125 may be entirely disposed in the center portion S and may be partially disposed at the extending portion E, as mentioned above.

As shown in FIG. 8, a protective layer 127 may be formed.

The protective layer 127 may be formed along a surface formed by the second electrode 125 and the piezoelectric layer 123. Although not shown in the drawing, the protective layer 127 may also be formed on the outwardly exposed insertion layer 170.

The protective layer 127 may be formed of one of silicon oxide-based, silicon nitride-based, aluminum oxide-based, and aluminum nitride-based insulating materials. However, the material of the protective layer 127 is not limited thereto.

After the protective layer 127 and the piezoelectric layer 123 are partially removed to partially expose the first electrode 121 and the second electrode 125, a first metal layer 180 and a second metal layer 190 may be formed in the exposed portions of the first electrode 121 and the second electrode 125, respectively.

The first and second metal layers 180 and 190 may be formed of gold (Au), gold-tin (Au—Sn) alloy, copper (Cu), copper-tin (Cu—Sn) alloy, aluminum (Al), aluminum-germanium (Al—Ge) alloy or the like and may be formed by depositing one of the materials on the first electrode 121 or the second electrode 125, respectively. However, the present example is not limited thereto.

A cavity C may be formed.

Figure 9:
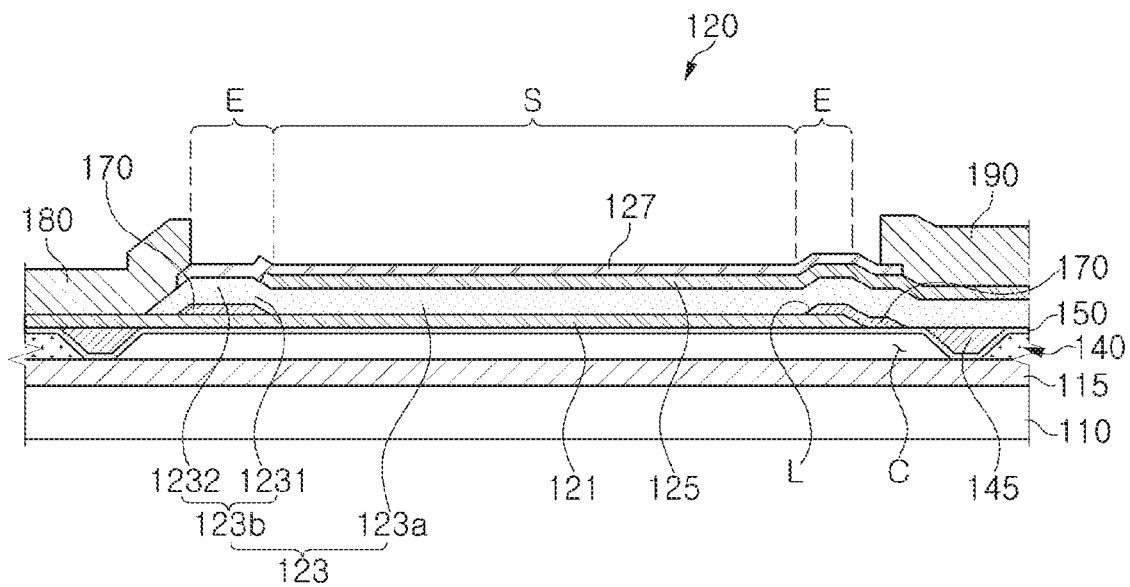
FIGS. 9 and 10 are cross-sectional views of an acoustic resonator according to an example.

As illustrated in FIG. 9, the cavity C may be formed by removing a portion disposed inside the etch-stop layer 145 in the sacrificial layer to complete the acoustic resonator 110 shown in FIGS. 2 and 3. The sacrificial layer 140 removed during the removal process may be removed by an etching technique.

When the sacrificial layer 140 is formed of polysilicon or polymer, the sacrificial layer 140 may be removed through dry etching using a halide etching gas (e.g., XeF2) such as fluorine (F), chlorine (Cl) or the like.

In the above-configured acoustic resonator according to an example, the extending portion E of the resonant portion 120 may be formed to be thicker than the center portion S of the resonant portion 120 due to the insertion layer 170. Thus, a vibration generated in the center portion S is prevented from propagating outwardly to increase a Q-factor of an acoustic resonator.

Additionally, the second electrode 125 may be partially disposed in the extending portion E to provide significantly improved resonance performance.

Moreover, the entire surface of the resonant portion 120 may be formed to have an asymmetrical polygonal shape to significantly reduce a spacing distance between acoustic resonators. As a result, a size of an acoustic resonator filter may be significantly reduced.

An acoustic resonator according to an example is not limited to the foregoing examples and various modifications may be made.

Figure 10:
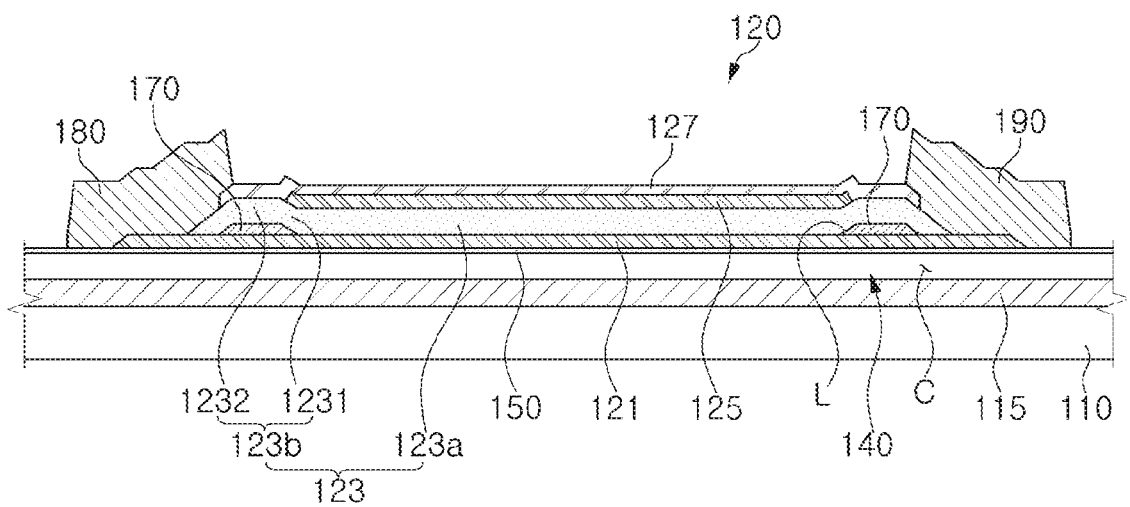

FIGS. 9 and 10 are cross-sectional views of an acoustic resonator according to another example. FIG. 9 corresponds to the cross-sectional view taken along line I-I' in FIG. 1B, and FIG. 10 corresponds to the cross-sectional view taken along line II-II' in FIG. 1B.

Referring to FIGS. 9 and 10, an insertion layer 170 of an acoustic resonator according to an example is entirely removed except for only a portion supporting a piezoelectric layer 123 in a resonant portion 120. Similarly, the insertion layer 170 may be partially disposed, if necessary.

When an acoustic resonator is configured in the above manner, the insertion layer 170 may not be disposed to be in contact with a first metal layer 180 or an etch-stop portion 145. The insertion layer 170 may not be disposed in an outward direction to a resonant portion 120 but may be disposed in a top region of a cavity C. However, a region in which the insertion layer 170 is disposed is not limited to the regions shown in FIGS. 9 and 10, and may extend in various directions, if necessary.

Figure 11:
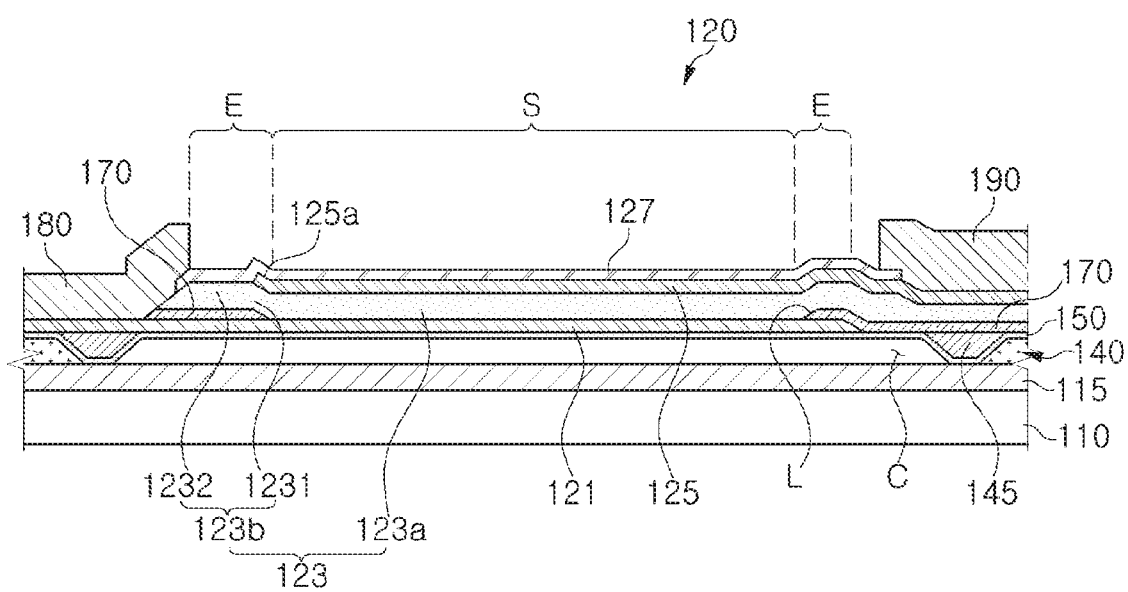
FIGS. 11 to 13 are cross-sectional views of an acoustic resonator according to an example.
Figure 12:
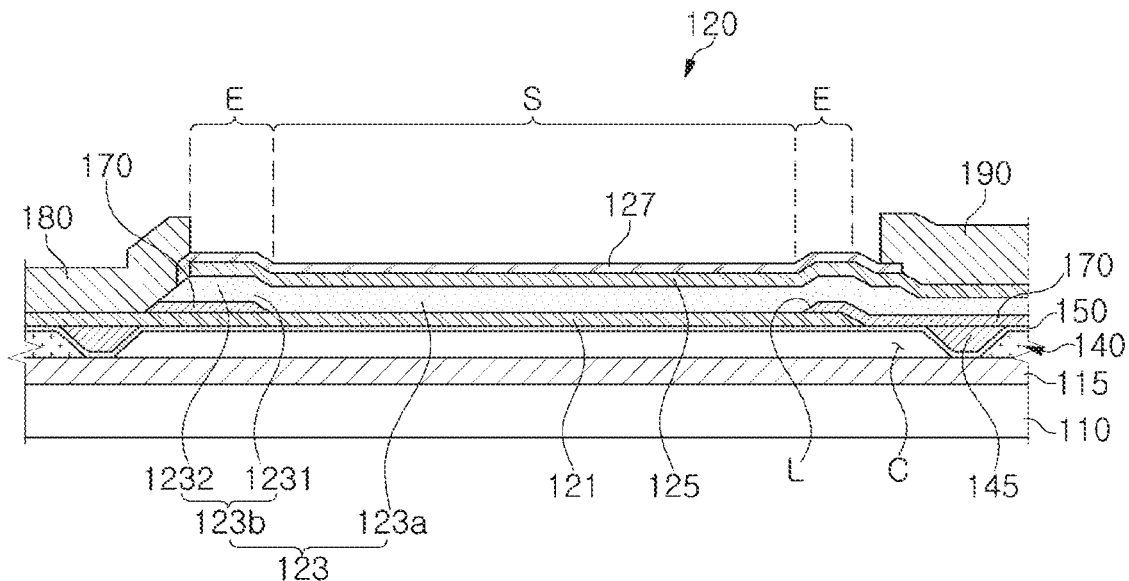

FIGS. 11 to 13 are cross-sectional views of an acoustic resonator according to another example.

In an acoustic resonator shown in FIG. 11, a portion of a second electrode 125 disposed within an extending portion E may be disposed on an entire inclined surface of an inclined portion 1231 of a piezoelectric layer 123.

In an acoustic resonator shown in FIG. 12, a second electrode 125 may be disposed on an entire top surface of a piezoelectric layer 123. Thus, the second electrode 125 may be disposed on the inclined portion 1231 of the piezoelectric layer 123 as well as an extending portion 1232 of the bent portion 123b.

In an acoustic resonator shown in FIG. 13, a second electrode 125 may only be disposed on a top surface of a piezoelectric portion 123a of a piezoelectric layer 123 and may not be disposed on a bent portion 123b.

As described above, in an acoustic resonator according to an example, a structure of an extending portion E may be variously modified, if necessary.

Figure 14:
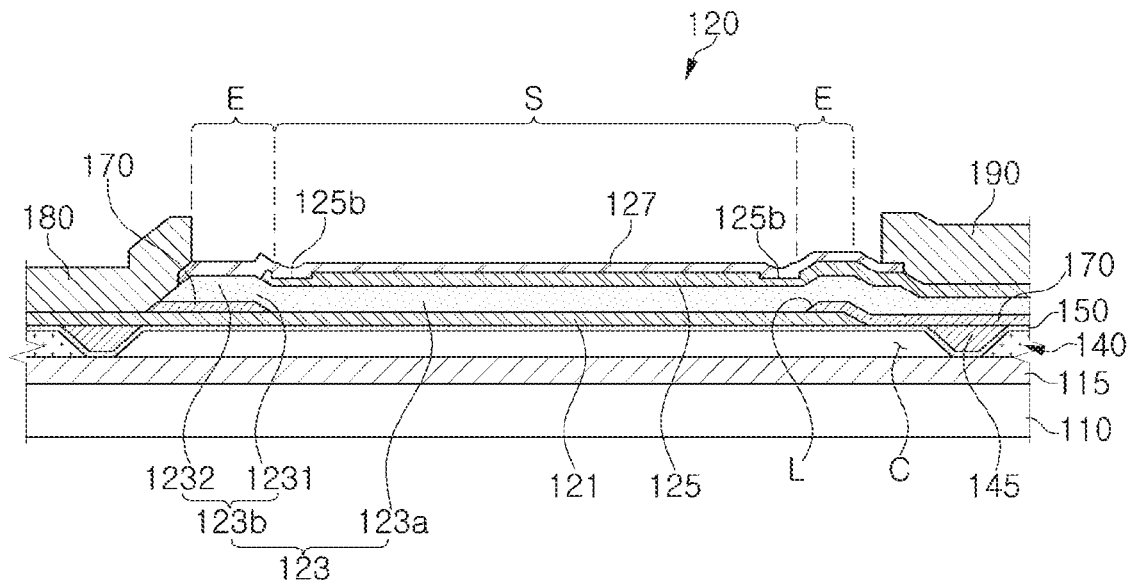
FIG. 14 is a cross-sectional view of an acoustic resonator according to an example.

FIG. 14 is a cross-sectional view of an acoustic resonator according to another example.

Referring to FIG. 14, an acoustic resonator has at least one trench 125b on a second electrode 125.

The trench 125b is formed on the second electrode 125 disposed within a center portion S and may be formed as a groove to decrease a thickness of the second electrode 125. The trench 125b may be formed along a boundary of the center portion S or formed adjacent to an edge of the center portion S.

The trench 125b may be formed to have a continuous annular shape or to have a structure in which some regions are disconnected. However, the present example is not limited thereto. The trench 125b may be formed as a plurality of partially or discontinuously arc-shaped grooves.

The trench 125b may be formed in such a manner that its width is greater than its depth.

Figure 15:
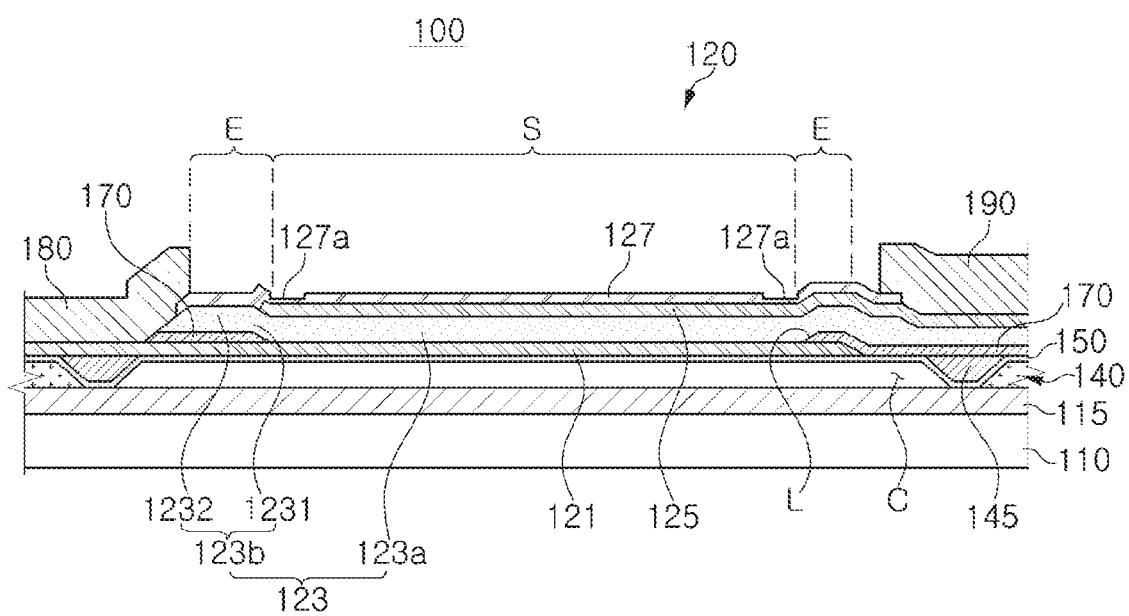
FIG. 15 is a cross-sectional view of an acoustic resonator according to an example.

FIG. 15 is a cross-sectional view of an acoustic resonator according to another example and shows a modified example of the acoustic resonator shown in FIG. 14.

Referring to FIG. 15, an acoustic resonator has a trench 127a formed on a protective layer 127.

The trench 127a is formed on the protective layer disposed within a center portion S and is formed as a groove to decrease a thickness of the protective layer 127. The trench 127a may be formed along a boundary of the center portion S, or may be disposed adjacent to an edge of the center portion S.

Similar to the above-described example, the trench 127a may be formed to have a continuous annular shape or to have a structure in which some regions are disconnected. The trench 127a may be formed in such a manner that its width is greater than its depth. However, the present example is not limited thereto.

Figure 16:
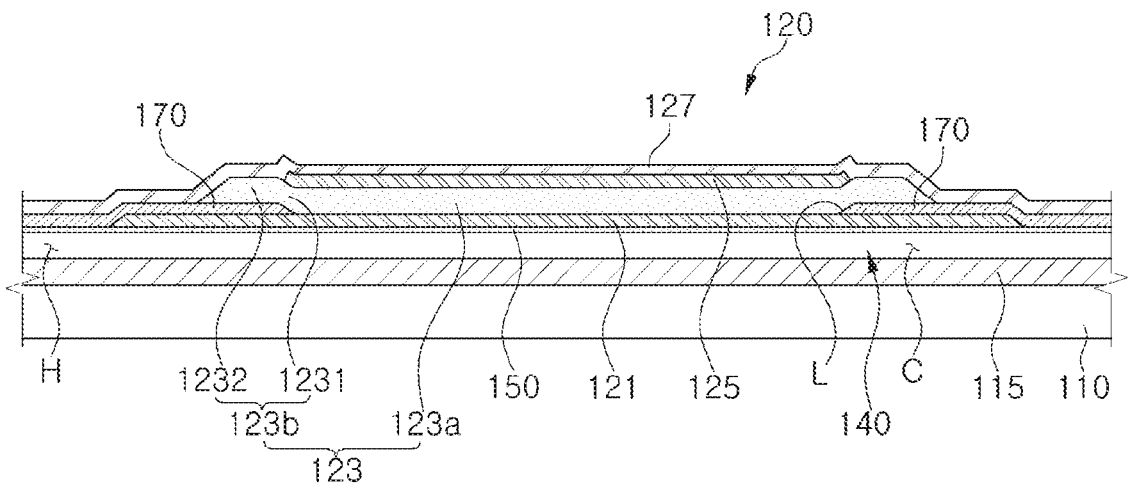
FIG. 16 is a cross-sectional view of an acoustic resonator according to an example.

FIG. 16 is a cross-sectional view of an acoustic resonator according to another example and shows a cross section corresponding to the cross section taken along line I-I' in FIG. 1B.

Referring to FIG. 16, an acoustic resonator according to the present example is configured similarly to the acoustic resonator shown in FIG. 3 but does not include a first metal layer 180 (FIG. 3) on a periphery of a resonant portion 120.

In this example, the first metal layer 180 may be disposed only on a connection wiring connected to an electrode of another acoustic resonator and may not be disposed around the resonant portion 120.

Accordingly, an insertion layer 170 and a protective layer 127 laminated on the insertion layer 170 may be disposed in an entire peripheral region of the resonant portion 120. However, the present example is not limited thereto and, if necessary, the insertion layer 170 and the protective layer 127 may be partially disposed in the peripheral region of the resonant portion 120.

Figure 17:
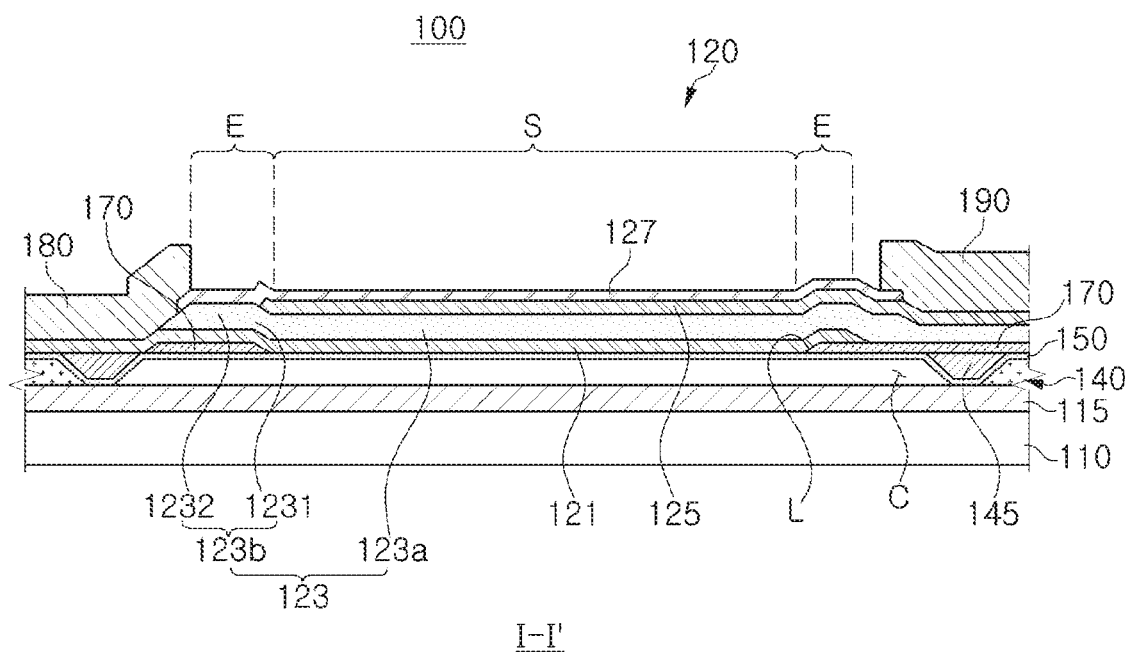
FIG. 17 is a cross-sectional view of an acoustic resonator according to an example.

FIG. 17 is a cross-sectional view of an acoustic resonator according to another example.

Referring to FIG. 17, an acoustic resonator according to the present example is configured similarly to the acoustic resonator shown in FIGS. 2 and 3. Unlike the acoustic resonator shown in FIGS. 2 and 3, the acoustic resonator shown in FIG. 17 includes an insertion layer 170 having at least one portion inserted between a membrane layer 150 and a first electrode 121.

In this case, the insertion layer 170 may be formed on the membrane layer 150 ahead of the first electrode 121 during a fabrication process, and the first electrode 121 may be formed on the insertion layer 170 to cover a portion of the insertion layer 170. Accordingly, an inclined surface may be formed on both the first electrode 121 and the piezoelectric layer 123.

Figure 18:
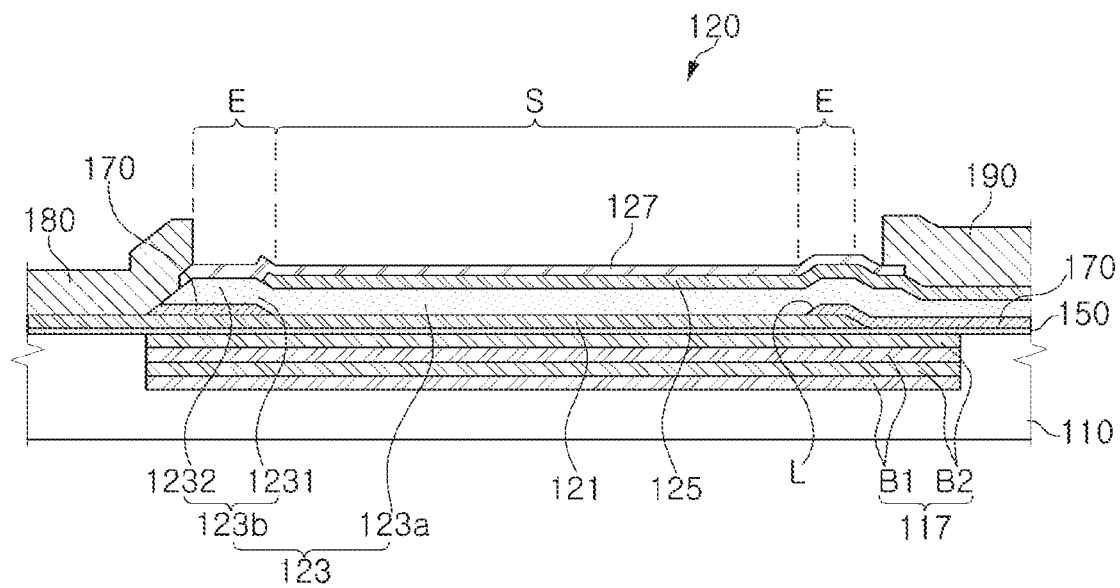
FIG. 18 is a cross-sectional view of an acoustic resonator according to an example.

FIG. 18 is a cross-sectional view of an acoustic resonator according to another example.

Referring to FIG. 18, an acoustic resonator according to the present example is configured similarly to the acoustic resonator shown in FIG. 3, does not include a cavity (C in FIG. 2) and includes a Bragg reflector layer 117.

The Bragg reflector layer 117 may be disposed inside a substrate 110. The Bragg reflector layer 117 is formed by alternately laminating a first reflector layer B1 having high acoustic impedance and a second reflector layer B2 having low acoustic impedance on a lower portion of the resonant portion 120.

Thicknesses of the first and second reflector layers B1 and B2 are defined according to a specific wavelength and reflect an acoustic wave to a side of the resonant portion 120 in a vertical direction to prevent the acoustic wave from propagating to a lower side of the substrate 110.

To this end, the first reflector layer B1 is formed of a material having a higher density than a material of the second reflector layer B2. For example, one of tungsten (W), molybdenum (Mo), ruthenium (Ru), iridium (Ir), tantalum (Ta), platinum (Pt), and copper (Cu) may be selectively used as the material of the first reflector layer B1. The second reflector layer B2 is formed of a material having a lower density than the material of the first reflector layer B1. For example, one of silicon oxide ($SiO_2$), silicon nitride ($Si_3N_4$), and aluminum nitride (AlN) may be selectively used as the material of the second reflector layer B2. However, the present example is not limited thereto.

Figure 19:
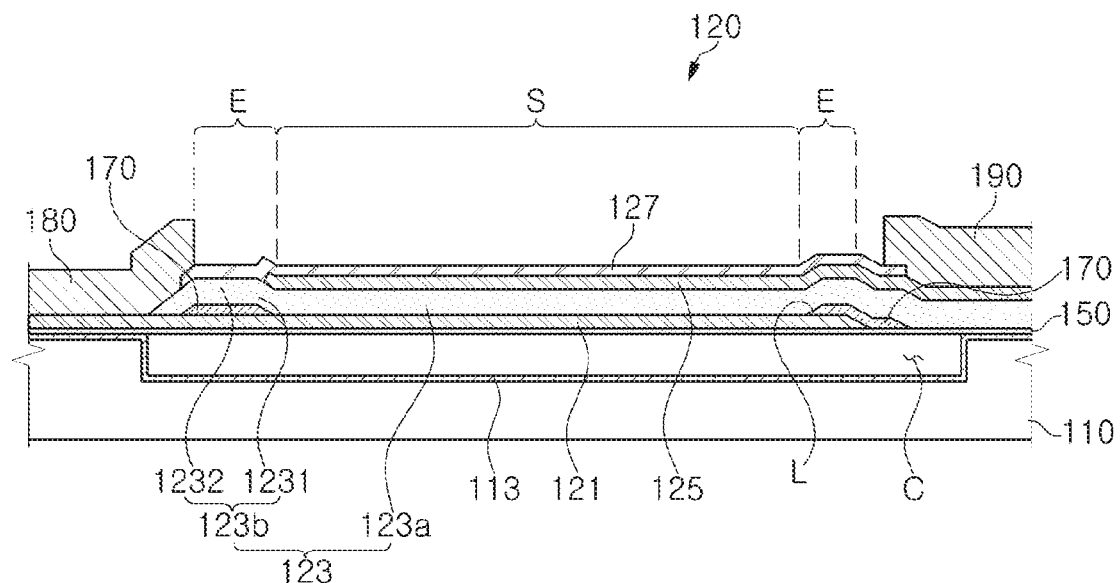
FIG. 19 is a cross-sectional view of an acoustic resonator according to an example.

FIG. 19 is a cross-sectional view of an acoustic resonator according to another example.

Referring to FIG. 19, an acoustic resonator according to the present example is configured similarly to the acoustic resonator show in FIG. 3. A cavity C may not be formed on a substrate 110, but may instead be formed by partially removing the substrate 110.

The cavity C may be formed by etching a top surface of the substrate 110. The etching may be either dry etching or wet etching.

A barrier layer 113 may be formed on an inner surface of the cavity C. The barrier layer 113 protects the substrate 110 from an etchant used during formation of the resonant portion 120.

The barrier layer 113 may include a dielectric such as aluminum nitride (AlN), silicon oxide ($SiO_2$) or similar materials, but the present example is not limited thereto. Various materials may be used as the material of the barrier layer 113 as long as they can protect the substrate 110 from an etchant.

Hereinafter, a method of fabricating an acoustic resonator according to an example will be briefly described. After a cavity C is formed in a substrate 100, a barrier layer 113 may be formed in the cavity C.

The cavity C is filled with a material, which may be silicon oxide ($SiO_2$).

After a top surface of the substrate 110 is planarized through a chemical mechanical polishing (CMP) process or the like, a first electrode 121, an insertion layer 170, a piezoelectric layer 122, a second electrode 125, and the like are sequentially deposited to form a resonant portion 120.

The material filling the cavity C is removed using the etchant. As a result, an acoustic resonator is completed.

In the above-configured acoustic resonator, an inclined portion is formed on a piezoelectric layer and a second electrode in an extending portion to prevent a lateral vibration from moving outwardly. As a result, performance of the acoustic resonator may be enhanced.

As described above, in an acoustic resonator according to an example, an inclined region is formed at a piezoelectric layer and a second electrode by an insertion layer disposed below the piezoelectric layer to prevent a lateral vibration from moving outwardly. Thus, performance of the acoustic resonator may be enhanced.

An entire plane of the resonant portion may be formed to have an asymmetrical polygonal shape. Thus, a spacing distance between acoustic resonators is significantly reduced to significantly reduce a size of the acoustic resonator.

When a plane of the resonant portion has a symmetrical polygonal shape, a lateral wave may be reflected from an opposite side, and thus a new resonance mode may be created to increase loss of an acoustic resonator. Meanwhile, when a plane of the resonant portion has an asymmetrical polygonal shape, a lateral wave may exclude a resonance mode forming a stationary wave to reduce loss caused by the resonance mode.

As compared to a symmetrically polygonal shape, an asymmetrical polygonal shape may allow placement between a plurality of acoustic resonators to be free in a device in which the plurality of acoustic resonators should be provided.

Furthermore, in a polygonal shape formed by the plane of the resonant portion, an angle of inclination of an insertion layer disposed in the center of a side is formed to be relatively smaller and an angle of inclination of a vertex where interference of lateral acoustic waves increases is formed to be relatively larger. Thus, loss of the lateral acoustic wave at the vertex may be further reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
   a substrate; and
   a resonant portion comprising a center portion in which a first electrode, a piezoelectric layer and a second electrode are sequentially laminated on the substrate, and an extending portion disposed along a periphery of the center portion,
   wherein the resonant portion is configured to have an asymmetrical polygonal plane,
   an insertion layer is disposed below the piezoelectric layer in the extending portion, and the piezoelectric layer is configured to have a top surface which is raised to conform to a shape of the insertion layer, and
   the insertion layer is configured to have an asymmetrical polygonal shape corresponding to a shape of the extending portion, and
   wherein the insertion layer is configured to have an inclined surface which has a thickness that is increased as a distance of the insertion layer from the center portion increases.

2. The acoustic resonator of claim 1, wherein
   the piezoelectric layer includes an inclined portion that is disposed on the inclined surface.

3. The acoustic resonator of claim 2, wherein the second electrode is configured to have at least a portion disposed in the extending portion.

4. The acoustic resonator of claim 3, wherein the piezoelectric layer includes an extending portion that extends outwardly from the inclined portion of the piezoelectric layer, and
   the second electrode is configured to be disposed on the inclined portion of the piezoelectric layer and the extending portion of the piezoelectric layer.

5. The acoustic resonator of claim 3, wherein the second electrode disposed in the extending portion is configured to be disposed on an inclined surface of the inclined portion of the piezoelectric layer, and is configured to be disposed to have an area smaller than an area of the inclined surface of the inclined portion of the piezoelectric layer.

6. The acoustic resonator of claim 3, wherein the second electrode disposed within the extending portion is configured to be disposed on an entire inclined surface of the inclined portion of the piezoelectric layer.

7. The acoustic resonator of claim 2, wherein the insertion layer includes at least three sides and at least three vertices on which the at least three sides are connected, and
   an angle of inclination of the inclined surface in a center of each of the at least three sides is different from an angle of inclination of the inclined surface at an end of each of the at least three sides.

8. The acoustic resonator of claim 7, wherein the angle of inclination of the insertion layer is configured to be in a range of 5 degrees to 70 degrees.

9. The acoustic resonator of claim 7, wherein the angle of inclination of the inclined surface in the center of each of the at least three sides of the insertion layer is smaller than the angle of inclination of the inclined surface at the end of each of the at least three sides.

10. The acoustic resonator of claim 7, wherein the angle of inclination of the inclined surface at the end of each of the at least three sides of the insertion layer is greater than the angle of inclination of the inclined surface in the center of each of the at least three sides by 5 degrees or more.

11. The acoustic resonator of claim 1, wherein the insertion layer is configured to have at least a portion which is disposed below the first electrode or the second electrode or between the first electrode and the piezoelectric layer.

12. The acoustic resonator of claim 1, wherein the insertion layer is formed of a material that is different from a material of the piezoelectric layer.

13. The acoustic resonator of claim 1, wherein the insertion layer is formed of a dielectric.

14. An acoustic resonator filter comprising:
    a substrate; and
    a first resonator and a second resonator disposed adjacent to the substrate, each of the first resonator and the second resonator are configured to have a plane of an asymmetrical polygonal shape,
    wherein each of the first resonator and the second resonator includes a center portion in which a first electrode, a piezoelectric layer, and a second electrode are sequentially laminated, and an extending portion disposed along a periphery of the center portion, and
    wherein an insertion layer is disposed below the piezoelectric layer in the extending portion, and the piezoelectric layer is configured to have a top surface which is raised to conform to a shape of the insertion layer, and wherein the insertion layer is configured to have an inclined surface which has a thickness that is increased as a distance of the insertion layer from the center portion increases.

15. The acoustic resonator filter of claim 14, wherein one side of the asymmetrical polygonal shape formed by the first resonator and one side of the asymmetrical polygonal shape formed by the second resonator are disposed to face each other.

16. The acoustic resonator filter of claim 14, wherein the insertion layer includes at least three sides arranged linearly and having an inclined surface and at least three vertices on which the at least three sides are connected, and the inclined surface has an angle of inclination at a center of a side different from an angle of inclination at an end of each of the at least three sides.

17. A method comprising:

forming an acoustic resonator on a surface of a substrate;

forming a resonant portion comprising a first electrode, a piezoelectric layer and a second electrode sequentially laminated on the substrate, and an extending portion disposed along a periphery of the center portion;

forming an insertion layer below the piezoelectric layer in the extending portion;

forming the piezoelectric layer to have a top surface which is raised to conform to a shape of the insertion layer;

forming the insertion layer to have an asymmetrical polygonal shape corresponding to a shape of the extending portion, and forming the insertion layer to have an inclined surface which has a thickness that is increased as a distance of the insertion layer from the center portion increases.

18. The method of claim 17, wherein the piezoelectric layer includes an inclined portion that is disposed on the inclined surface.

19. The method of claim 18, wherein the second electrode is configured to have at least a portion disposed in the extending portion.

20. The method of claim 17, wherein the insertion layer is configured to have at least a portion which is disposed below the second electrode or between the first electrode and the piezoelectric layer.

* * * * *